(12) United States Patent
Kim et al.

(10) Patent No.: US 11,557,584 B2
(45) Date of Patent: Jan. 17, 2023

(54) INTEGRATED CIRCUIT INCLUDING SIMPLE CELL INTERCONNECTION AND METHOD OF DESIGNING THE SAME

(71) Applicant: SAMSUNG ELECTRONICS CO., LTD., Suwon-si (KR)

(72) Inventors: Yongcheul Kim, Suwon-si (KR); Jooyeon Kwon, Hwaseong-si (KR); Sangdo Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 17/106,787

(22) Filed: Nov. 30, 2020

(65) Prior Publication Data
US 2021/0384186 A1    Dec. 9, 2021

(30) Foreign Application Priority Data
Jun. 9, 2020 (KR) .................. 10-2020-0069831

(51) Int. Cl.
*H01L 27/02* (2006.01)
*G06F 30/392* (2020.01)
*H01L 27/092* (2006.01)
*H01L 23/528* (2006.01)

(52) U.S. Cl.
CPC ........ *H01L 27/0207* (2013.01); *G06F 30/392* (2020.01); *H01L 23/528* (2013.01); *H01L 27/0924* (2013.01)

(58) Field of Classification Search
CPC ............ H01L 27/0207; H01L 27/0924; H01L 27/0886; H01L 23/528; H01L 23/5283; H01L 21/823821; H01L 21/823871; G06F 30/392; G06F 30/39; G06F 30/3953
See application file for complete search history.

(56) References Cited

U.S. PATENT DOCUMENTS

| | | | |
|---|---|---|---|
| 7,240,257 B2 | 7/2007 | Jeon et al. | |
| 7,647,574 B2 | 1/2010 | Haruki | |
| 7,930,670 B2 | 4/2011 | Cox | |
| 2015/0102413 A1* | 4/2015 | Azmat | H01L 23/5384 257/365 |
| 2017/0062475 A1* | 3/2017 | Song | G06F 30/30 |
| 2017/0338229 A1* | 11/2017 | Oh | H01L 27/092 |
| 2018/0365368 A1* | 12/2018 | Do | G06F 30/392 |
| 2019/0268000 A1* | 8/2019 | Song | H01L 27/0886 |

FOREIGN PATENT DOCUMENTS

| | | | |
|---|---|---|---|
| JP | 2003-030265 A | 1/2003 | |
| JP | 3641209 B2 | 4/2005 | |
| JP | 2008-235513 A | 10/2008 | |
| JP | 2010-287768 A | 12/2010 | |

* cited by examiner

*Primary Examiner* — Nelson Garces
(74) *Attorney, Agent, or Firm* — Sughrue Mion, PLLC

(57) ABSTRACT

An integrated circuit (IC) includes: a first cell including an input pin and an output pin extending in a first direction; a second cell adjacent to the first cell in the first direction and including an input pin and an output pin extending in the first direction; a first cell isolation layer extending between the first cell and the second cell in a second direction crossing the first direction; and a first wire extending in the first direction, overlapping the first cell isolation layer, and being connected to the output pin of the first cell and the input pin of the second cell, wherein the output pin of the first cell, the input pin of the second cell, and the first wire are formed in a first conductive layer as a first pattern extending in the first direction.

20 Claims, 19 Drawing Sheets

INTEGRATED CIRCUIT INCLUDING SIMPLE CELL INTERCONNECTION AND METHOD OF DESIGNING THE SAME

CROSS-REFERENCE TO THE RELATED APPLICATION

This application is based on and claims priority from Korean Patent Application No. 10-2020-0069831, filed on Jun. 9, 2020, in the Korean Intellectual Property Office, the disclosure of which is incorporated herein in its entirety by reference.

BACKGROUND

Apparatuses and methods consistent with example embodiments of the inventive concept relate to an integrated circuit (IC) and, more particularly, to an IC including a simple cell interconnection.

Along with the development of a semiconductor process, the size of devices has been decreased, and the number of devices integrated in an IC has increased. According to such a decrease in the size of and an increase in the number of devices included in an IC, the complexity of wirings for interconnecting the devices may increase, which may limit a level of integration of the IC and increase a delay of a signal to be delivered through the wirings, thereby limiting the performance improvement of the IC.

SUMMARY

Example embodiments of the inventive concept provide an integrated circuit (IC) with reduced complexity of wirings according to a simple cell interconnection and a method of designing the IC.

According to embodiments, there is provided an IC including: a first cell including an input pin and an output pin extending in a first direction; a second cell adjacent to the first cell in the first direction and including an input pin and an output pin extending in the first direction; a first cell isolation layer extending between the first cell and the second cell in a second direction crossing the first direction; and a first wire extending in the first direction, overlapping the first cell isolation layer, and connected to the output pin of the first cell and the input pin of the second cell, wherein the output pin of the first cell, the input pin of the second cell, and the first wire are formed in a first conductive layer as a first pattern extending in the first direction.

According to embodiments, there is provided an IC including: a first cell and a second cell, each including an input pin and an output pin in a back-end-of-line (BEOL) and having a same specification; a third cell adjacent to the first cell in a first direction; and a fourth cell adjacent to the second cell in the first direction, wherein the output pin of the first cell and an input pin of the third cell, or the input pin of the first cell and an output pin of the third cell are formed in a first conductive layer as a first pattern extending in the first direction, the output pin of the second cell and an input pin of the fourth cell, or the input pin of the second cell and an output pin of the fourth cell are formed in the first conductive layer as a second pattern extending in the first direction, and the BEOL of the first cell structurally differs from the BEOL of the second cell.

According to embodiments, there is provided a method of designing an IC, the method including: placing a first cell from a cell library based on input data defining the IC; placing a second cell from the cell library to be adjacent to the first cell in a first direction, based on the input data; adding a first wire connecting an output pin of the first cell to an input pin of the second cell, based on the input data; and generating output data defining a layout of the IC, wherein the output data defines a first pattern extending in the first direction in a first conductive layer and forming the output pin of the first cell, the input pin of the second cell, and the first wire.

According to embodiments, there is provided a method of generating a cell library defining cells included in an IC, the method including: obtaining an input cell library; extracting locations of input pins and output pins of a plurality cells from a cell group including the plurality of cells in the input cell library; extracting a primitive cell from the input cell library; generating at least one variant cell by changing a location of an input pin and/or a location of an output pin of the primitive cell based on the extracted locations of the input pins and the output pins of the cells; and generating an output cell library defining the primitive cell and the at least one variant cell.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

The embodiments described herein are all example embodiments, and thus, the inventive concept is not limited thereto and may be realized in various other forms. Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof.

Figure 1:
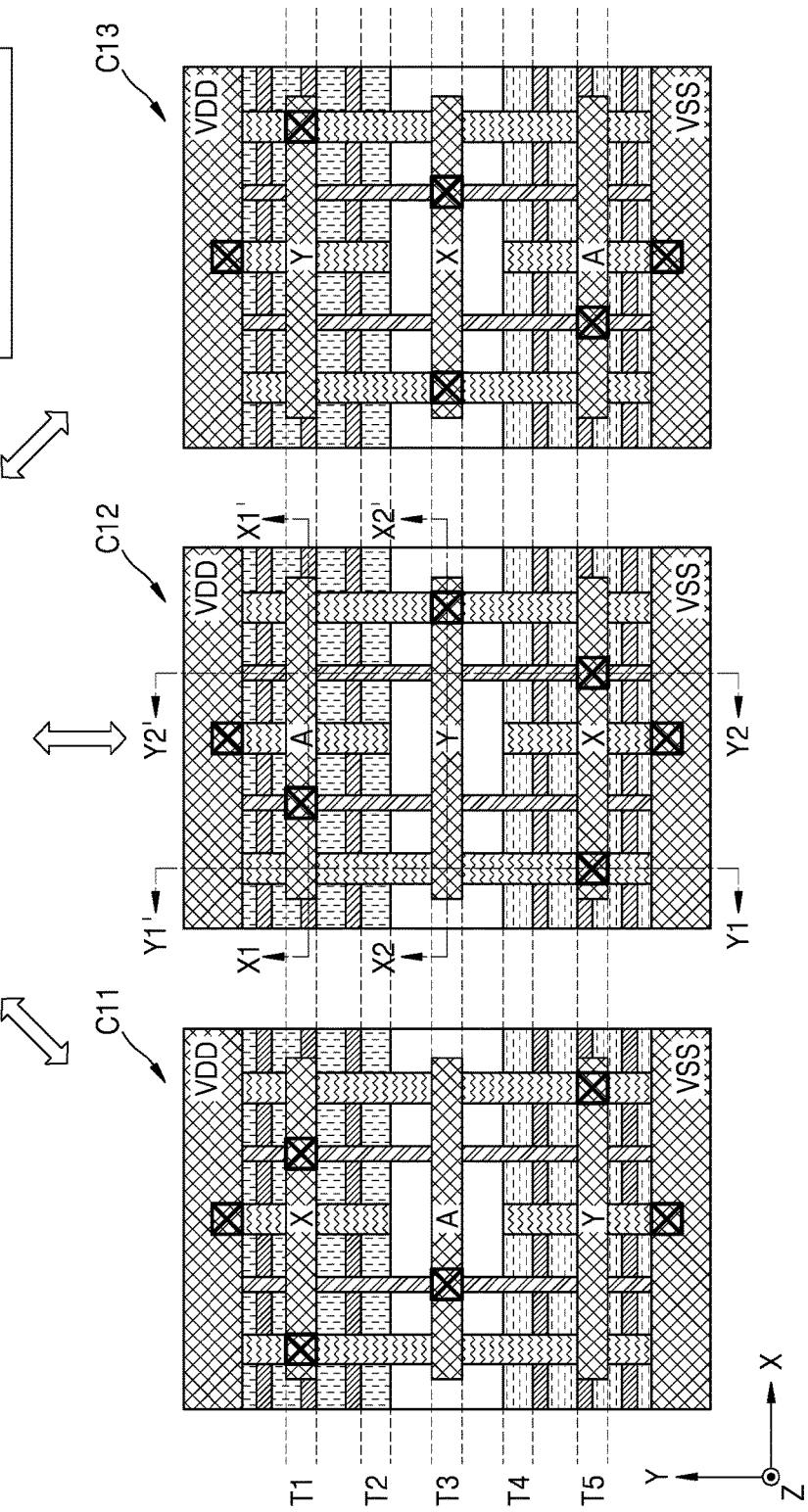
FIG. 1 is a view of cells according to an embodiment.
Figure 1:
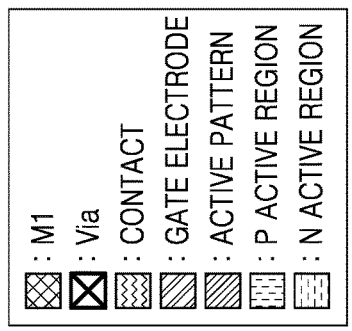
Figure 1:
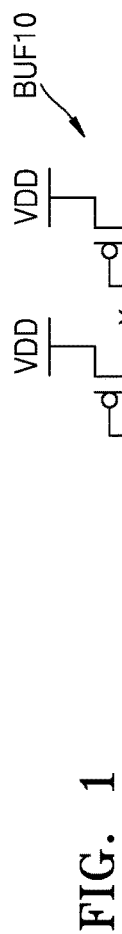

It will be understood that when an element or layer is referred to as being "over," "above," "on," "below," "under," "connected to" or "coupled to" another element or layer, it can be directly over, above, on, below, under, connected or coupled to the other element or layer or intervening elements or layers may be present. In contrast, when an element is referred to as being "directly over," "directly above," "directly on," "directly below," "directly under," "directly connected to" or "directly coupled to" another element or layer, there are no intervening elements or layers present. Like numerals refer to like elements throughout FIG. 1 is a view of cells according to an embodiment. Particularly, an upper part of FIG. 1 indicates a circuit diagram of a buffer BUF10, and a lower part of FIG. 1 schematically shows layouts of cells (or buffer cells), e.g., first to third cells C11, C12, and C13, corresponding to the buffer BUF10, on a plane formed by an X-axis and a Y-axis. Herein, an X-axis direction and a Y-axis direction may be referred to as a first direction and a second direction, respectively, and a Z-axis direction may be referred to as a vertical direction. The plane formed by the X-axis and the Y-axis may be referred to as a horizontal plane, a component relatively placed in a +Z direction than another component may be referred to as a component over another component, and a component relatively placed in a −Z direction than another component may be referred to as a component below another component. In addition, an area of a component may indicate a size occupied by the component on a plane parallel to the horizontal plane. In the drawings herein, only some layers may be shown for convenience of drawing, and to indicate a connection between a pattern of a wiring layer and a lower pattern, a via may be shown even though the via is below the pattern of the wiring layer.

An integrated circuit (IC) may include a plurality of cells. A cell is a unit of a layout included in an IC. A cell may be designed to perform a pre-defined function. A cell may be referred to as a standard cell. An IC may include a plurality of various cells which may be aligned along a plurality of rows. For example, referring to FIG. 1, each of the first to third cells C11, C12, and C13 may be on a row extending in the X-axis direction. In a boundary between rows, patterns (may be referred to as power lines herein) to which a positive supply voltage VDD and a negative supply voltage VSS (or a ground potential) are applied may extend in the X-axis direction, and an active region in which a P-type transistor is formed and an active region in which an N-type transistor is formed may extend in the X-axis direction. Like the first to third cells C11, C12, and C13, a cell placed in a single row may be referred to as a single height cell, and like a second cell C42 of FIG. 4, a cell continuously placed in two or more adjacent rows may be referred to as a multiple height cell.

As shown in FIG. 1, at least one active pattern in an active region may extend in the X-axis direction, and the active pattern may form a transistor by intersecting with a gate electrode extending in the Y-axis direction. When a fin-shaped active pattern extends in the X-axis direction, a transistor formed by the active pattern and a gate electrode may be referred to as a fin field-effect transistor (FinFET). As described below with reference to FIGS. 2A to 2D, embodiments will be described mainly with reference to cells including a FinFET, but it would be understood that the embodiments may also be applied to cells including a transistor having a different structure from the FinFET. For example, an active pattern may include a plurality of nanosheets separated from each other in the Z-axis direction and extending in the X-axis direction, and a cell may include a multi-bridge channel FET (MBCFET) formed by the plurality of nanosheets and a gate electrode. In addition, the cell may include a ForkFET having a structure in which an N-type transistor is relatively close to a P-type transistor by isolating nanosheets for the P-type transistor from nanosheets for the N-type transistor by a dielectric wall. In addition, the cell may include a vertical FET (VFET) having a structure in which source/drain regions are separated from each other in the Z-axis direction with a channel region therebetween, and a gate electrode encompasses the channel region. Alternatively, the cell may include another type of FET such as a complementary FET (CFET), a negative CFET (NCFET), or a carbon nanotube (CNT) FET, or include a bipolar junction transistor or another three-dimensional transistor.

Referring to FIG. 1, the buffer BUF10 may include two inverters connected in series. The buffer BUF10 may generate, at an internal node X, a signal obtained by inverting a signal received through an input pin A and output, through an output pin Y, a signal obtained by inverting the signal of the internal node X. The first to third cells C11, C12, and C13 may have the same specification, e.g., the same threshold voltage, function, and driving strength, and the buffer BUF10 may be implemented in a layout of an IC as one of the first to third cells C11, C12, and C13. In some embodiments, the buffer BUF10 may be implemented in a layout of an IC as one of four or more different cells.

Each of the first to third cells C11, C12, and C13 may include the input pin A and/or the output pin Y at different locations. Referring to FIG. 1, each of the input pin A and the output pin Y of the buffer BUF10 may be formed as a pattern of a first wiring layer M1 on one of first to fifth tracks T1 to T5 extending in parallel to one another in the X-axis direction. For example, the first cell C11 may include the input pin A formed on the third track T3 and the output pin Y formed on the fifth track T5, the second cell C12 may include the input pin A formed on the first track T1 and the output pin Y formed on the third track T3, and the third cell C13 may include the input pin A formed on the fifth track T5 and the output pin Y formed on the first track T1. As described below with reference to FIGS. 2A to 2D, the first wiring layer M1 and a via connected to a lower surface of the first wiring layer M1 may be referred to as a back-end-of-line (BEOL) of an IC, and the first to third cells C11, C12, and C13 may have different BEOLs. In some embodiments, a pattern formed in the first wiring layer M1 may include a conductive material, e.g., a metal, and may be referred to as a first metal layer.

One of the first to third cells C11, C12, and C13 may be selected based on a location of an input pin and/or an output pin of an adjacent cell, and the buffer BUF10 may be implemented as the selected cell in a layout of an IC. For example, when an output pin of a cell configured to provide a signal to the input pin A of the buffer BUF10 is formed on the first track T1, the second cell C12 including the input pin A formed on the first track T1 may be selected, and the buffer BUF10 may be implemented as the second cell C12 in a layout of an IC. Alternatively, when an input pin of a cell configured to receive a signal from the output pin Y of the buffer BUF10 is formed on the first track T1, the third cell C13 including the output pin Y formed on the first track T1 may be selected, and the buffer BUF10 may be implemented as the third cell C13 in a layout of an IC. An input pin and an output pin on a same track may be electrically connected through a wire formed on a corresponding track, and accordingly, the input pin, the output pin, and the wire may be formed as a single pattern extending in the X-axis direction in the first wiring layer M1. As a result, the use of a higher wiring layer, e.g., a second wiring layer M2, for electrically connecting an input pin and an output pin of cells may be avoided, and complexity and routing congestion of wirings may be reduced. As described above, a simple cell interconnection may cause a decrease in a space for routing and an increase in a level of integration of an IC. In addition, delay of a signal through a wire may be avoided to improve the performance of an IC, and simplification of a semiconductor process may result in reduction of costs and time for fabricating an IC and enhanced reliability of the IC.

Figure 2A:
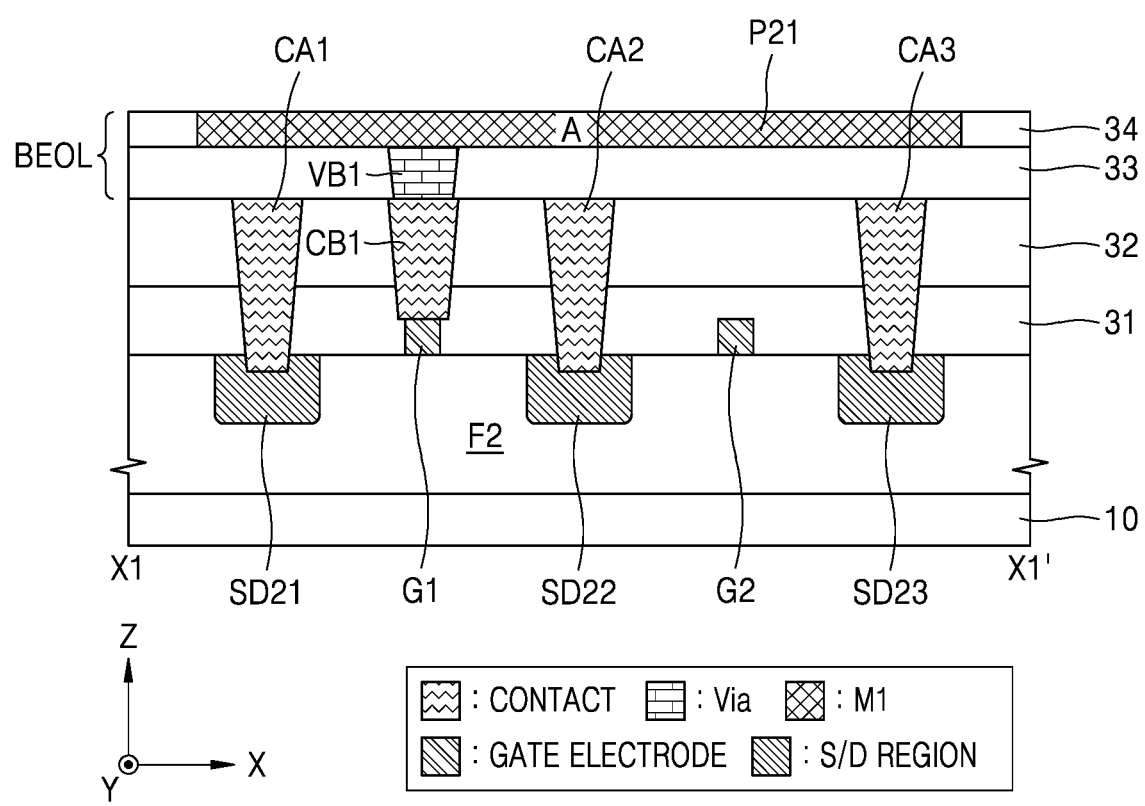
FIGS. 2A to 2D are cross-sectional views of structures of cells according to an embodiment.
Figure 2B:
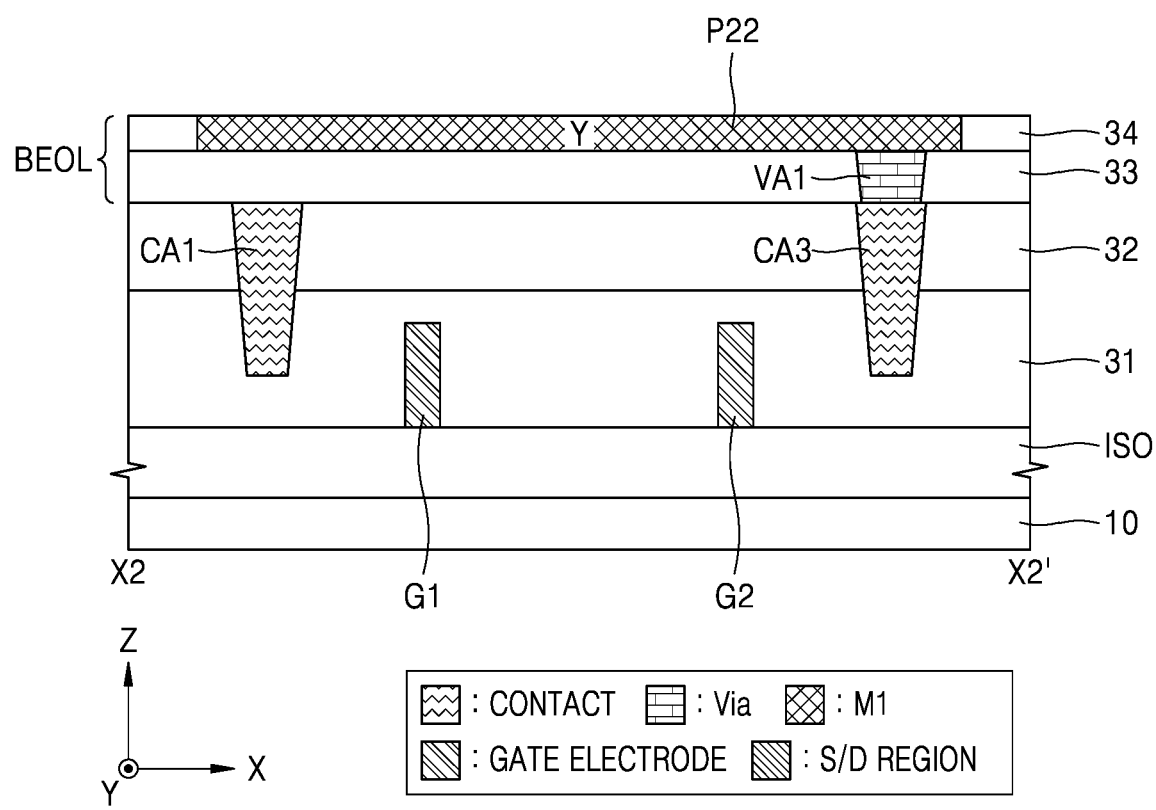
Figure 2C:
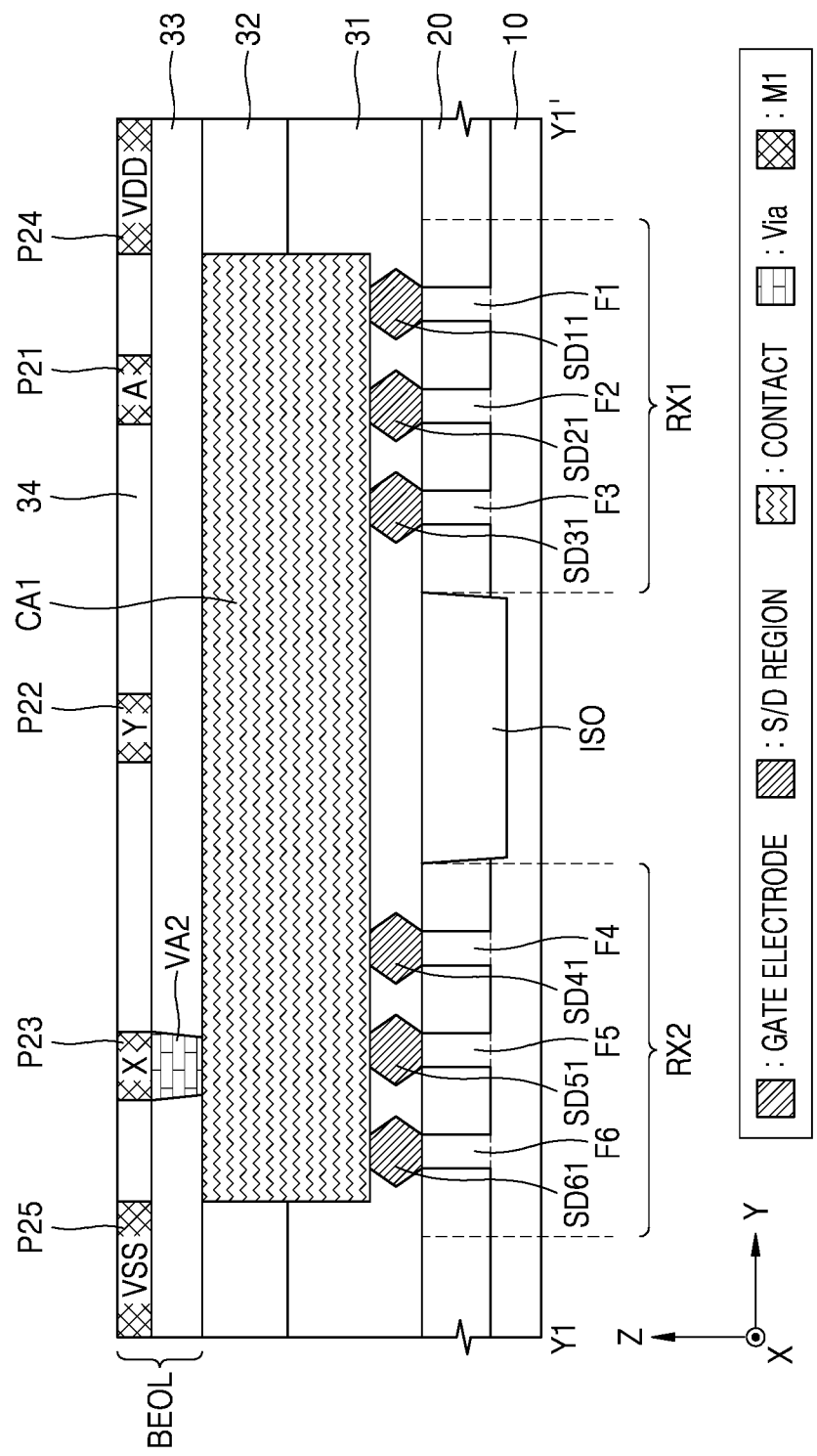
Figure 2D:
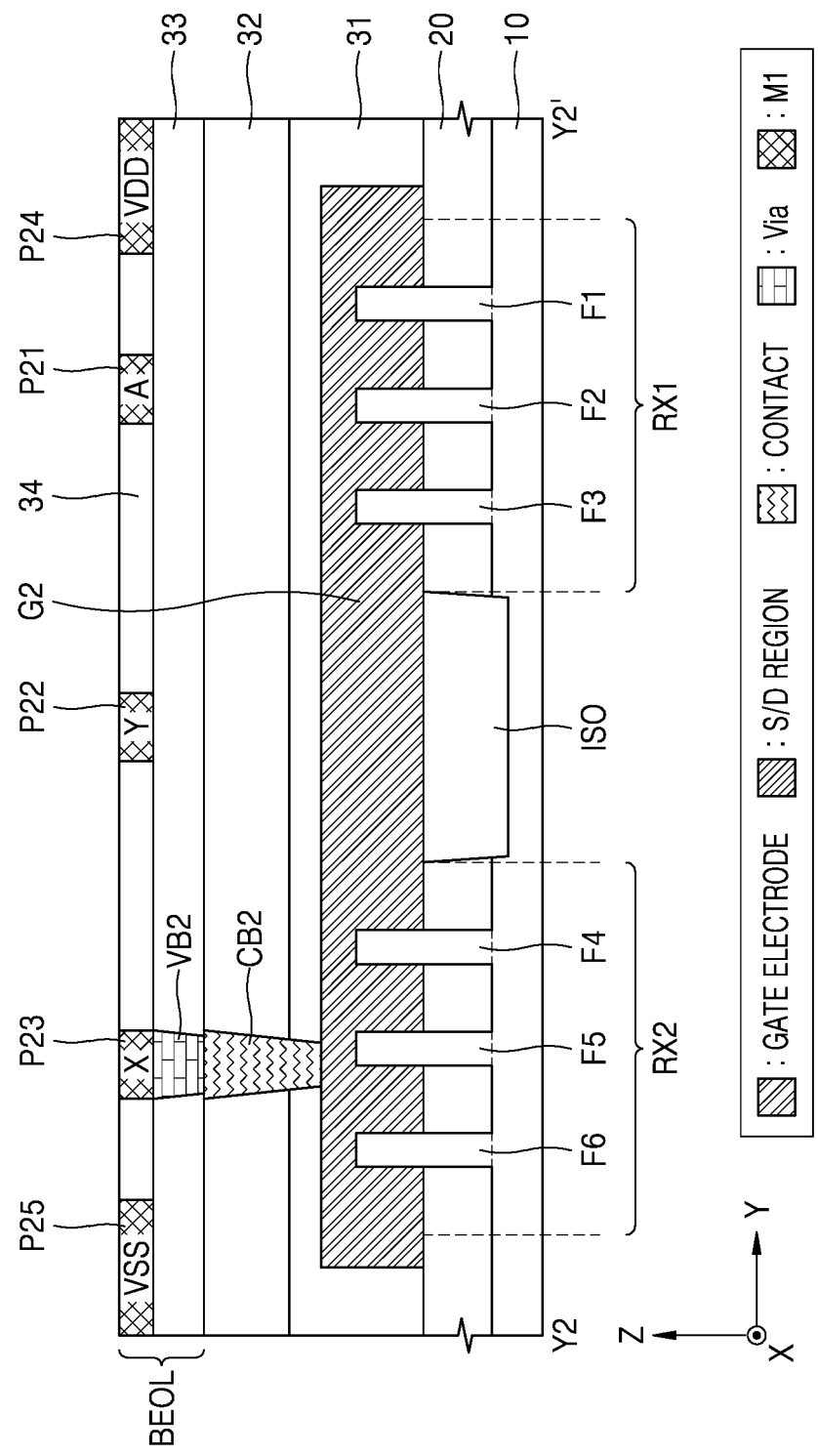

FIGS. 2A to 2D are cross-sectional views of structures of cells according to an embodiment. Particularly, the cross-sectional view of FIG. 2A shows a cross-section of the second cell C12 taken along line X1-X1' of FIG. 1, the cross-sectional view of FIG. 2B shows a cross-section of the second cell C12 taken along line X2-X2' of FIG. 1, the cross-sectional view of FIG. 2C shows a cross-section of the second cell C12 taken along line Y1-Y1' of FIG. 1, the cross-sectional view of FIG. 2D shows a cross-section of the second cell C12 taken along line Y2-Y2' of FIG. 1. Although not shown in FIGS. 2A to 2D, a gate spacer may be formed on a side of a gate electrode, and a gate dielectric layer may be formed between the gate electrode and the gate spacer and on a lower surface of the gate electrode. In addition, a barrier layer may be formed on a surface of a contact and/or a via. Hereinafter, FIGS. 2A to 2D will be described with reference to FIG. 1, and a description made with reference to FIG. 1 is not repeated in a description of FIGS. 2A to 2D for brevity.

Referring to FIG. 2A, a substrate 10 may include bulk silicon or a silicon-on-insulator (SOI), and as a non-limited example, the substrate 10 may include silicon germanium (SiGe), silicon germanium on insulator (SGOI), indium antimonide (InSb), a lead telluride (PbTe) compound, indium arsenide (InAs), phosphide, gallium arsenide (GaAs), gallium antimonide (GaSb), or the like. A second fin F2 may extend in the X-axis direction on the substrate 10, and first to third source/drain (S/D) regions SD21 to SD23 may be formed in the second fin F2. First to fourth interlayer insulating layers 31 to 34 may be formed on the second fin F2. The first and second source/drain regions SD21 and SD22 may form a transistor, i.e., a p-type field effect transistor (PFET), with a first gate electrode G1, and the second and third source/drain regions SD22 and SD23 may form another PFET with a second gate electrode G2.

First to third source/drain contacts CA1 to CA3 may be connected to the first to third source/drain regions SD21 to SD23 by passing through the second interlayer insulating layer 32. In some embodiments, at least one of the first to third source/drain contacts CA1 to CA3 may be formed as a lower source/drain contact passing through the first interlayer insulating layer 31 and an upper source/drain contact passing through the second interlayer insulating layer 32. A first gate contact CB1 may be connected to the first gate electrode G1 by passing through the second interlayer insulating layer 32.

A first gate via VB1 may be connected to the first gate contact CB1 and an input pin P21 by passing through the third interlayer insulating layer 33. Accordingly, the input pin P21 may be electrically connected to the first gate electrode G1 through the first gate via VB1 and the first gate contact CB1. In some embodiments, unlike as shown in FIG. 2A, the first gate contact CB1 may not be included in the second cell C12, and the input pin P21 may be electrically connected to the first gate electrode G1 through a gate via passing through the second and third interlayer insulating layers 32 and 33. A layer in which the first gate via VB1 and the third interlayer insulating layer 33 are formed may be referred to as a first via layer, and a layer in which the input pin P21 and the fourth interlayer insulating layer 34 are formed may be referred to as the first wiring layer M1. As shown in FIG. 2A, the first via layer, the first wiring layer M1, and their higher layers may be referred to as a BEOL.

Referring to FIG. 2B, a device isolation layer ISO may be formed on the substrate 10. The device isolation layer ISO may isolate active regions from each other as described below with reference to FIGS. 2C and 2D. The first to fourth interlayer insulating layers 31 to 34 may be formed on the device isolation layer ISO, and the first and third source/drain contacts CA1 and CA3 may pass through the second interlayer insulating layer 32. A first source/drain via VA1 may be connected to the third source/drain contact CA3 by passing through the third interlayer insulating layer 33, and connected to an output pin P22 formed in the first wiring layer M1.

Referring to FIG. 2C, a field insulating layer 20 may be formed on the substrate 10. The field insulating layer 20 may include, as a non-limited example, silicon dioxide ($SiO_2$), silicon nitride (SiN), silicon oxynitride (SON), silicon oxycarbonitride (SiOCN), or a combination of two or more thereof. In some embodiments, the field insulating layer 20 may encompass some of side surfaces of active pattern, i.e. a fin, as shown in FIG. 2C. The first to fourth interlayer insulating layers 31 to 34 may be formed on the field insulating layer 20. First to sixth fins F1 to F6 may extend in the X-axis direction in the field insulating layer 20, and six source/drain regions SD11 to SD61 may be formed on the first to sixth fins F1 to F6, respectively. The device isolation layer ISO may extend in the X-axis direction between the first to third fins F1 to F3 and the fourth to sixth fins F4 to F6, and first and second active regions RX1 and RX2 may be isolated by the device isolation layer ISO.

The first source/drain contact CA1 may be connected to the six source/drain regions SD11 to SD61 by passing through the second interlayer insulating layer 32, and accordingly, the six source/drain regions SD11 to SD61 may be electrically connected to one another. A second source/drain via VA2 may be connected to the first source/drain contact CA1 by passing through the third interlayer insulating layer 33, and connected to a pattern P23 of the internal node X formed in the first wiring layer M1. In the first wiring layer M1, a pattern P24 to which the positive supply voltage VDD is applied and a pattern P25 to which the negative supply voltage VSS is applied may extend in the X-axis direction, and the input pin P21 and the output pin P22 may be formed.

Referring to FIG. 2D, the field insulating layer 20 may be formed on the substrate 10, and the first to sixth fins F1 to F6 passing through the field insulating layer 20 may intersect with the second gate electrode G2 extending in the Y-axis direction. The second gate electrode G2 may include, as a non-limited example, titanium (Ti), tantalum (Ta), tungsten (W), aluminum (Al), cobalt (Co), or a combination of two or more thereof, or include a non-metal such as Si or SiGe. According to another embodiment, the second gate electrode G2 may be formed by stacking two or more conductive materials, e.g., titanium nitride (TiN), tantalum nitride (TaN), titanium carbide (TiC), tantalum carbide (TaC), titanium aluminum carbide (TialC), or a work function control film including a combination of two or more thereof, and a filling conductive layer including W, Al, or the like.

A second gate contact CB2 may be connected to the second gate electrode G2 by passing through the second interlayer insulating layer 32. A second gate via VB2 may be connected to the second gate contact CB2 by passing through the third interlayer insulating layer 33, and connected to the pattern P23 of the internal node X formed in the first wiring layer M1. As described above with reference to FIG. 2A, in some embodiments, the second gate contact CB2 may not be included in the second cell C12, and instead, the pattern P23 of the internal node X may be connected to the second gate contact CB2 through a gate via.

Figure 3:
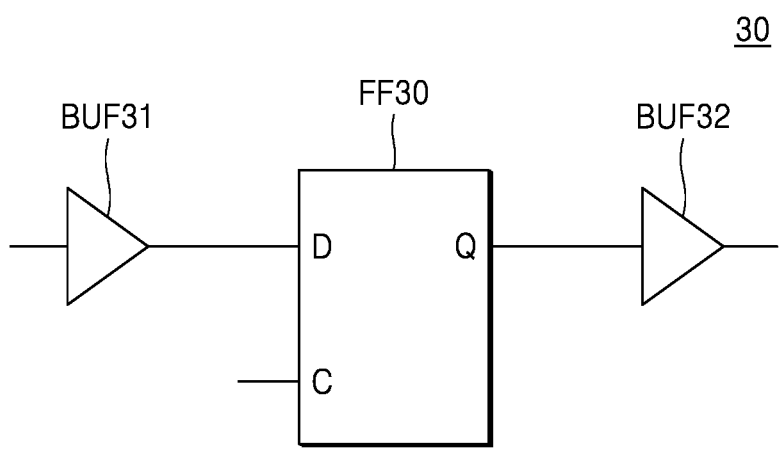
FIG. 3 is a block diagram of an integrated circuit (IC) according to an embodiment.
Figure 4:
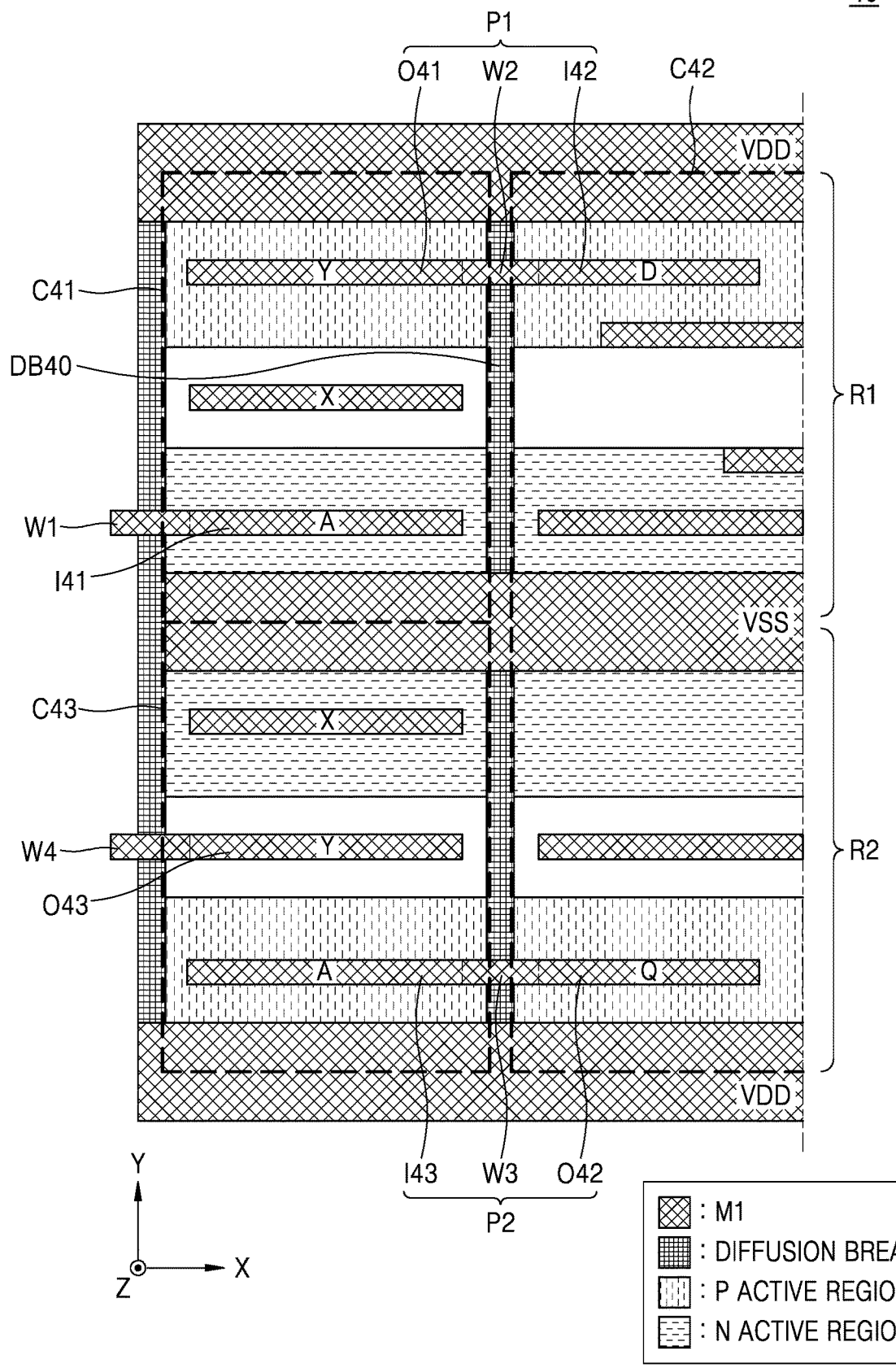
FIG. 4 is a layout of an IC according to an embodiment.

FIG. 3 is a block diagram of an IC according to an embodiment, and FIG. 4 is a layout of an IC according to an embodiment. Particularly, the block diagram of FIG. 3 shows an IC 30 including circuits corresponding to a plurality of cells, and a layout 40 of FIG. 4 is an example of a layout of the IC 30 and shows only some layers.

Referring to FIG. 3, the IC 30 may include a flip-flop FF30 and first and second buffers BUF31 and BUF32. The flip-flop FF30 may include a data input pin D, a clock input pin C, and a data output pin Q. The first buffer BUF31 may be connected to the data input pin D of the flip-flop FF30, and the second buffer BUF32 may be connected to the data output pin Q of the flip-flop FF30. A cell corresponding to the first buffer BUF31 may be selected based on a location of the data input pin D of the flip-flop FF30, and a cell corresponding to the second buffer BUF32 may be selected based on a location of the data output pin Q of the flip-flop FF30. In some embodiments, unlike as shown in FIG. 3, a circuit different from a buffer, e.g., an inverter or a delay circuit, may be connected to the data input pin D and the data output pin Q of the flip-flop FF30.

Referring to FIG. 4, the layout 40 may include a first cell C41, a second cell C42, and a third cell C43 respectively corresponding to the first buffer BUF31, the flip-flop FF30, and the second buffer BUF32 of FIG. 3. The first cell C41 may be in a first row R1, the second cell C42 may be in first and second rows R1 and R2, and the third cell C43 may be in the second row R2. That is, the first and third cells C41 and C43 may be single height cells, and the second cell C42 may be a multiple height cell. The first cell C41 may include an input pin I41 and an output pin O41 extending in the X-axis direction, the second cell C42 may include a data input pin I42 and a data output pin O42 extending in the X-axis direction, and the third cell C43 may include an input pin I43 and an output pin O43 extending in the X-axis direction. The first cell C41 may be isolated from the second cell C42 by a cell isolation layer DB40 extending in the Y-axis direction, and the second cell C42 may also be isolated from the third cell C43 by the cell isolation layer DB40 extending in the Y-axis direction.

The first cell C41 may include the output pin O41 aligned with the data input pin I42 of the second cell C42 in the X-axis direction, and the output pin O41 of the first cell C41 and the data input pin I42 of the second cell C42 may be connected to each other through a second wire W2. Accordingly, the output pin O41 of the first cell C41, the second wire W2, and the data input pin I42 of the second cell C42 may be formed as a first pattern P1 extending in the X-axis direction in the first wiring layer M1. Likewise, the third cell C43 may include the input pin I43 aligned with the data output pin O42 of the second cell C42 in the X-axis direction, and the data output pin O42 of the second cell C42 and the input pin I43 of the third cell C43 may be connected to each other through a third wire W3. Accordingly, the data output pin O42 of the second cell C42, the third wire W3, and the input pin I43 of the third cell C43 may be formed as a second pattern P2 extending in the X-axis direction in the first wiring layer M1. As a result, only patterns of the first wiring layer M1 may be used to interconnect the first cell C41, the second cell C42, and the third cell C43 respectively corresponding to the first buffer BUF31, the flip-flop FF30, and the second buffer BUF32 of FIG. 3. In addition, as shown in FIG. 4, the layout 40 may further include a first wire W1 connected to the input pin I41 of the first cell C41, and a fourth wire W4 connected to the output pin O43 of the third cell C43.

Figure 5:
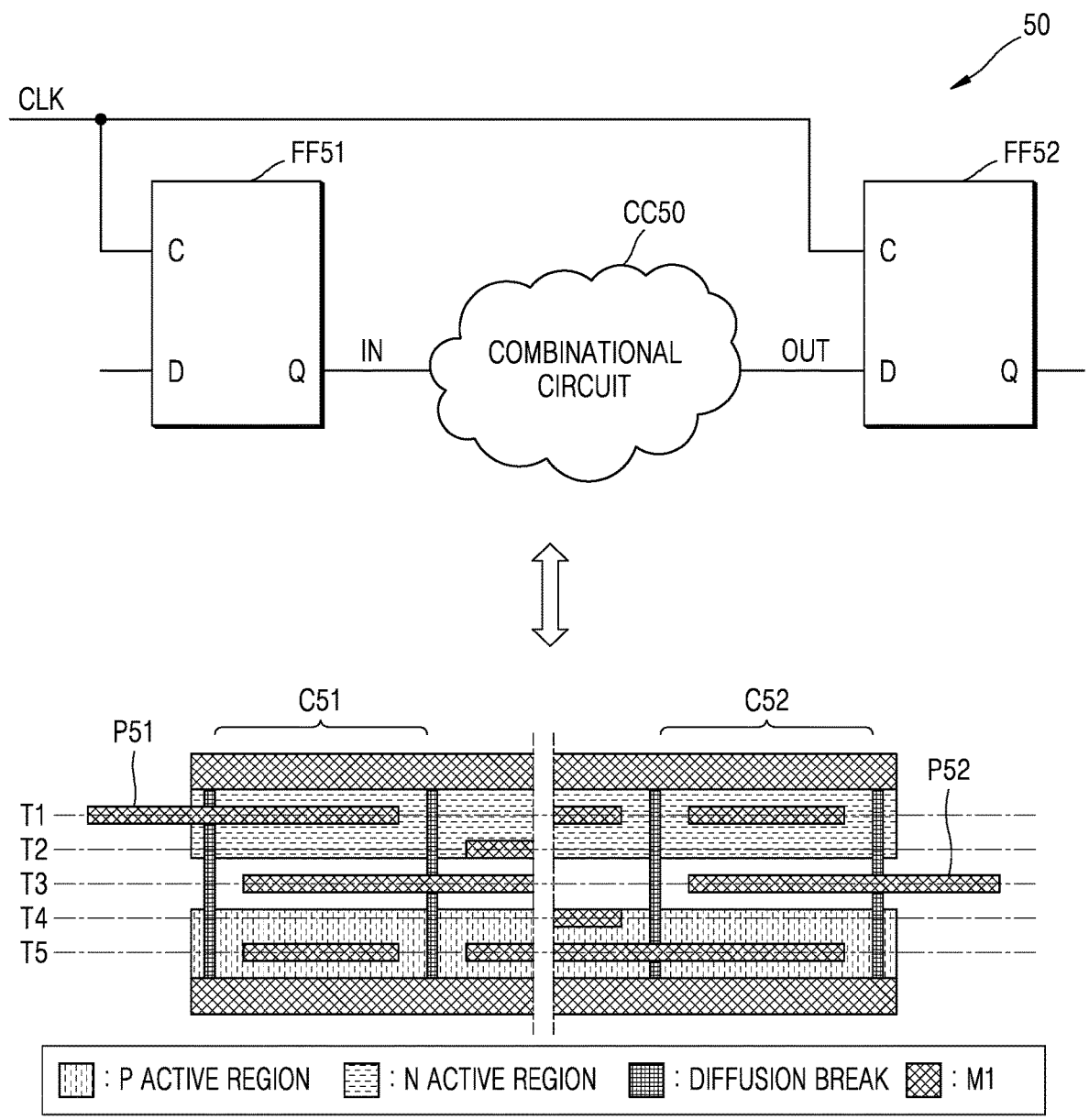
FIG. 5 is a block diagram of an IC according to embodiment.

FIG. 5 is a block diagram of an IC according to embodiments. Particularly, an upper part of FIG. 5 indicates a block diagram of an IC 50, and a lower part of FIG. 5 schematically indicates a layout corresponding to a combinational circuit CC50 of the IC 50.

Referring to FIG. 5, the IC 50 may include a first flip-flop FF51, the combinational circuit CC50, and a second flip-flop FF52. The first and second flip-flops FF51 and FF52 may commonly receive a clock signal CLK, the combinational circuit CC50 may generate an output signal OUT by processing an input signal IN received from the first flip-flop FF51 and provide the output signal OUT to the second flip-flop FF52.

In some embodiments, at least one cell corresponding to the combinational circuit CC50 configured to process a signal between the first and second flip-flops FF51 and FF52 may be connected to another cell through patterns of the first wiring layer M1. For example, as shown in FIG. 5, the layout of the IC 50 may include first and second cells C51 and C52 corresponding to the combinational circuit CC50, wherein the first cell C51 may receive the input signal IN, and the second cell C52 may output the output signal OUT. A data output pin Q P51 of the first flip-flop FF51 may be on the first track T1 of the layout, and accordingly, the first cell C51 may include an input pin on the first track T1. In addition, a data input pin D P52 of the second flip-flop FF52 may be on the third track T3 of the layout, and accordingly, the second cell C52 may include an output pin on the third track T3. As shown in FIG. 5, between the first and second cells C51 and C52, cells including an output pin and/or an input pin on a track on which an input pin and/or an output pin of an adjacent cell is located may be placed. Accordingly, a cell corresponding to the first flip-flop FF51, the first and second cells C51 and C52, and a cell corresponding to the second flip-flop FF52 may be connected to one another by patterns of the first wiring layer M1. In some embodiments, unlike as shown in FIG. 5, at least one input pin and at least one output pin of adjacent cells among cells corresponding to the combinational circuit CC50 may be connected to each other by a pattern of a higher wiring layer, e.g., a second wiring layer.

Figure 6A:
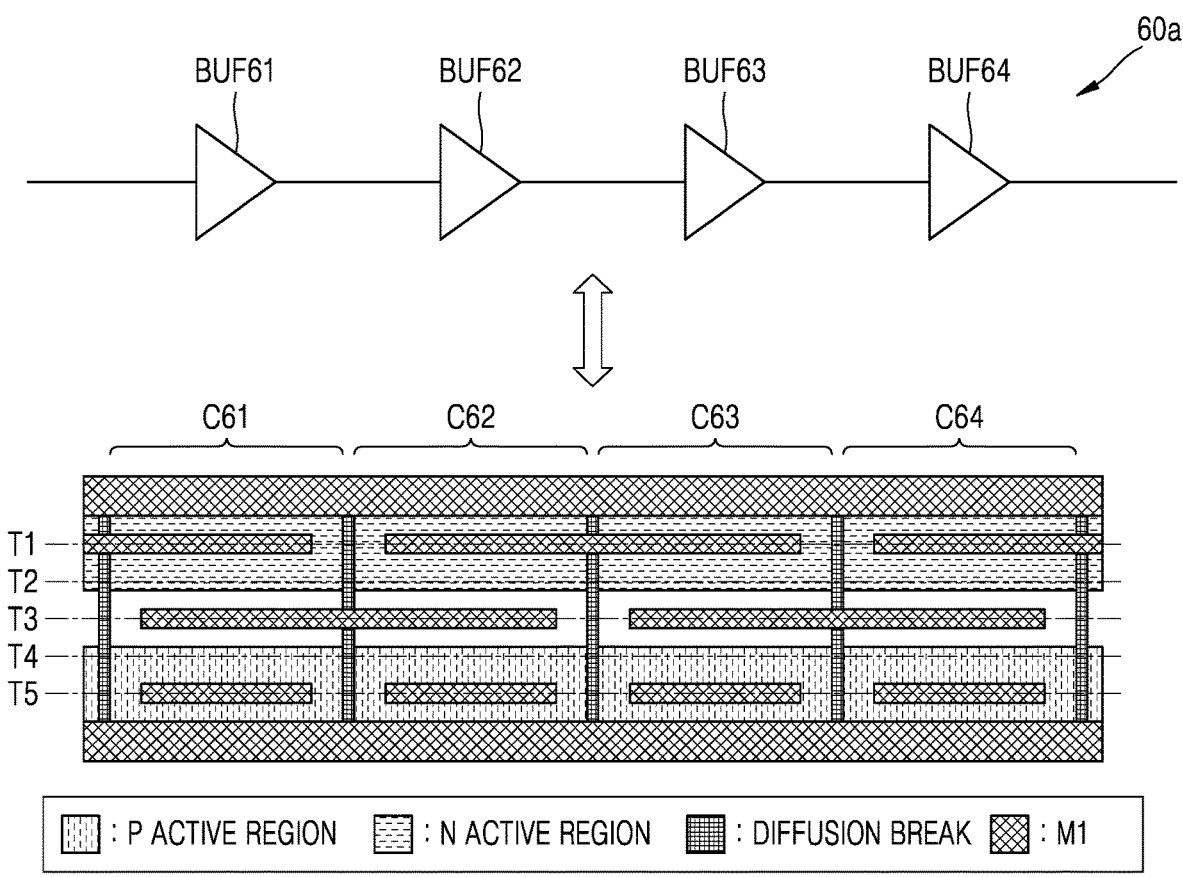
FIGS. 6A and 6B are views of ICs according to embodiment.
Figure 6B:
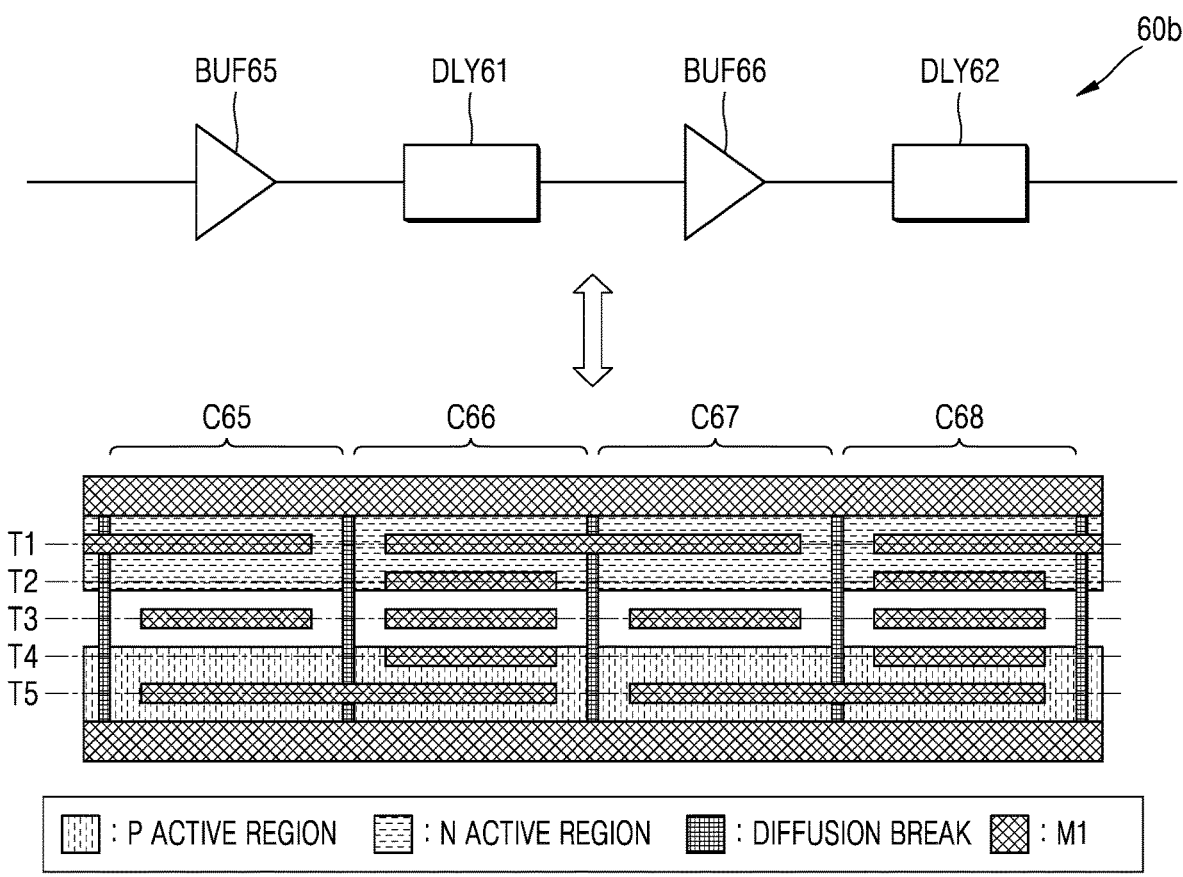

FIGS. 6A and 6B are views of ICs according to embodiments. Particularly, each of FIGS. 6A and 6B shows a block diagram and a layout of an IC.

In some embodiments, cells used to maintain a hold time may be connected to one another through patterns of the first wiring layer M1. A minimum hold time may be required regardless of a process variation and the like such that a subsequent circuit may properly process a signal output from a flip-flop in synchronized with a clock signal, and thus circuits, i.e., hold circuits, for satisfying the requirements of a hold time may be inserted between flip-flops. To ensure the minimum hold time, an IC may include the same hold circuits connected in series as described below with reference to FIG. 6A or different hold circuits connected in series as described below with reference to FIG. 6B.

Referring to FIG. 6A, an IC 60a may include a series of buffers, e.g., first to fourth buffers BUF61 to BUF64, to ensure the minimum hold time, and the first to fourth buffers BUF61 to BUF64 may be referred to as a buffer chain. In some embodiments, unlike as shown in FIG. 6A, an IC may include a series of delay cells (i.e., a delay chain) or a series of inverters (i.e., an inverter chain).

A layout of the IC 60a may include first to fourth cells C61 to C64 respectively corresponding to the first to fourth buffers BUF61 to BUF64, and the first to fourth cells C61 to C64 may include buffer cells configured to provide the same specification, e.g., the same function and driving strength but have different locations of input pins and output pins. For example, as shown in FIG. 6A, the first and third cells C61 and C63 may have the same layout and include an input pin formed on the first track T1 and an output pin formed on the third track T3. In addition, the second and fourth cells C62 and C64 may have the same layout and include an input pin formed on the third track T3 and an output pin formed on the first track T1. The number of buffers in the buffer chain of the IC 60a is not limited to four as shown in FIG. 6A, and instead, may be more or less than four according to embodiments.

Referring to FIG. 6B, an IC 60b may include different circuits, e.g., a fifth buffer BUF65, a first delay circuit DLY61, a sixth buffer BUF66, and a second delay circuit DLY62, to ensure the minimum hold time. A layout of the IC 60b may include fifth to eighth cells C65 to C68 respectively corresponding to the fifth buffer BUF65, the first delay circuit DLY61, the sixth buffer BUF66, and the second delay circuit DLY62. Each of the fifth to eighth cells C65 to C68 may include an output pin and/or an input pin formed on the same track as an input pin and/or an output pin of an adjacent cell. For example, as shown in FIG. 6B, the fifth and seventh cells C65 and C67 may have the same layout and include an input pin formed on the first track T1 and an output pin formed on the fifth track T5. In addition, the sixth and eighth cells C66 and C68 as delay cells may have the same layout and include an input pin formed on the fifth track T5 and an output pin formed on the first track T1. Here, each of the number of buffers and the number of delay circuits in the IC 60b is not limited to two as shown in FIG. 6A, and instead, may be more or less than two according to embodiments.

Figure 7:
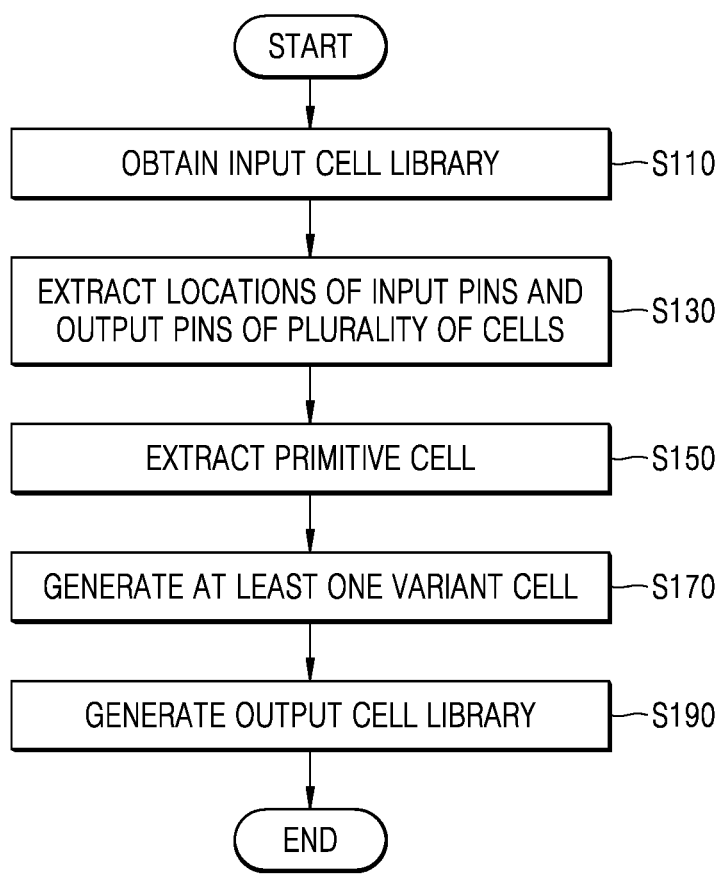
FIG. 7 is a flowchart of a method of designing an IC, according to an embodiment.

FIG. 7 is a flowchart of a method of designing an IC, according to an embodiment. Particularly, the flowchart of FIG. 7 shows a method of generating a cell library defining cells including an input pin and an output pin at different locations. In some embodiments, the method of FIG. 7 may be performed by a computing system (e.g., 140 of FIG. 14) including at least one processor configured to execute a series of computer instructions. As shown in FIG. 7, the method of generating a cell library may include a plurality of operations S110, S130, S150, S170, and S190.

In operation S110, an operation of obtaining an input cell library may be performed. The input cell library may define cells which may be provided by a semiconductor process and included in an IC. For example, the input cell library may include information about cells, e.g., function information, characteristic information, and layout information. In some embodiments, the input cell library may define one cell corresponding to a unique feature (or specification), e.g., a particular combination of a threshold voltage, a function, and a driving strength, and a corresponding cell may be referred to as a primitive cell.

In operation S130, an operation of extracting locations of input pins and output pins of a plurality of cells may be performed. For example, a cell group including a plurality of cells may be selected from among the cells defined by the input cell library obtained in operation S110, and an operation of extracting locations of input pins and locations of output pins from the cell group may be performed. Examples of the extracted locations of the input pins and the extracted locations of the output pins will be described below with reference to FIGS. 8A and 8B.

In operation S150, an operation of extracting a primitive cell may be performed. The primitive cell may indicate one cell corresponding to a particular combination of a threshold voltage, a function, a driving strength, and the like as described above. That is, the primitive cell as a cell which may be adjacent to the plurality of cells selected in operation S130 may be extracted from the input cell library. In some embodiments, operation S150 may be performed earlier than operation S130 or performed in parallel to operation S130.

In operation S170, an operation of generating at least one variant cell may be performed. Herein, a variant cell may indicate a cell having the same specification, e.g., the same threshold voltage, function, and driving strength, as a primitive cell but including an input pin and/or an output pin at different locations as those or that of the primitive cell. For example, when the first cell C11 of FIG. 1 is defined as a primitive cell in the input cell library, the second cell C12 and the third cell C13 of FIG. 1 may be variant cells of the first cell C11. The at least one variant cell may be generated by changing locations of an input pin and/or output pin of the primitive cell obtained in operation S150, based on the locations of the input pins and the locations of the output pins, which are extracted in operation S130. In some embodiments, operations S150 and S170 may be iteratively performed for a plurality of primitive cells which may be adjacent to the plurality of cells selected in operation S130. An example of operation S170 will be described below with reference to FIG. 9.

In operation S190, an operation of generating an output cell library may be performed. For example, the output cell library may be generated by adding, to the input cell library, information about the at least one variant cell generated in operation S170. Accordingly, the output cell library may define not only the primitive cell but also the at least one variant cell of the primitive cell, and the primitive cell and the at least one variant cell may be used to design an IC as described below with reference to FIGS. 10 and 12. As a result, the IC may include a simple cell interconnection.

Figure 8A:
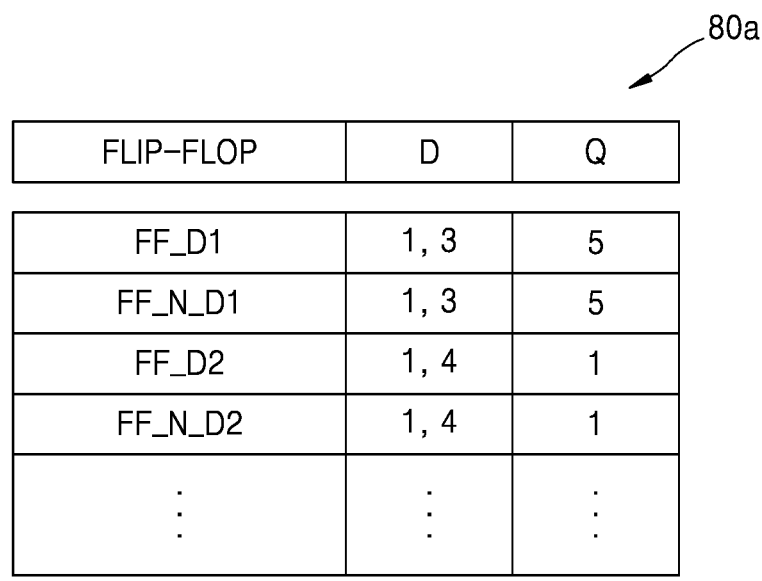
FIGS. 8A and 8B are tables indicating extracted locations of input pins and extracted locations of output pins, according to embodiment.
Figure 8B:
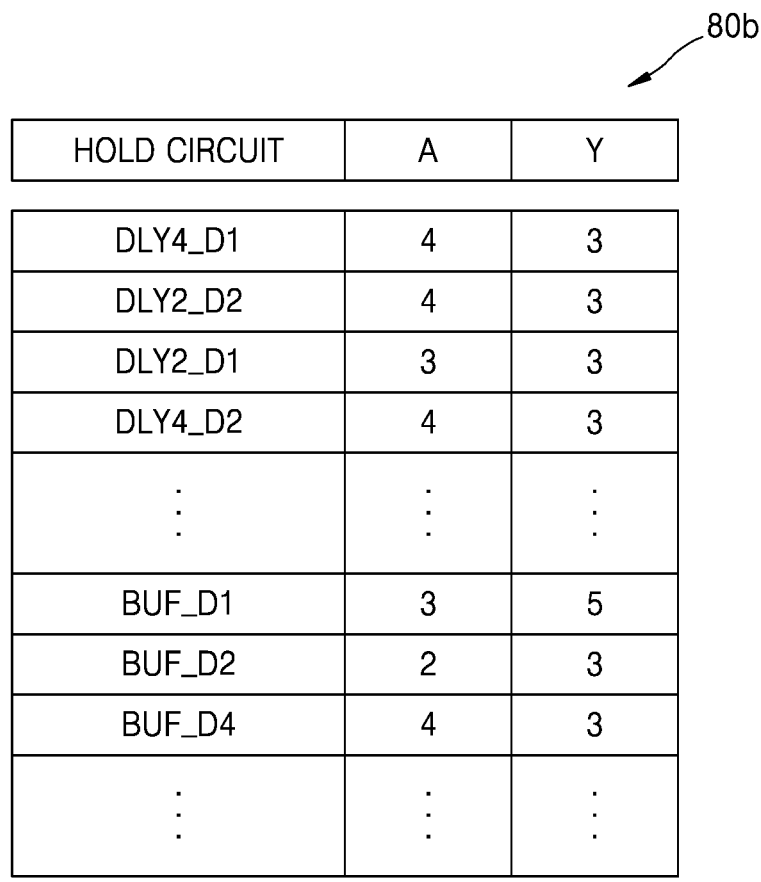

FIGS. 8A and 8B are tables indicating extracted locations of input pins and extracted locations of output pins, according to embodiments. In some embodiments, a table 80a of FIG. 8A and a table 80b of FIG. 8B may be generated in operation S130 of FIG. 7. Hereinafter, FIGS. 8A and 8B will be described with reference to FIG. 7.

Referring to FIG. 8A, a cell group including a plurality of cells corresponding to a flip-flop may be selected from the input cell library, and locations of input pins and locations of output pins may be extracted from the selected cell group. As shown in FIG. 8A, the input cell library may define a plurality of cells corresponding to a flip-flop, which have different functions and/or driving strengths. For example, "FF_D1" may provide a lower driving strength than "FF_D2", and "FF_N_D1" may provide a lower driving strength than "FF_N_D2". In addition, "FF_D1" and "FF_D2" may be positive edge triggered flip-flops configured to respond to a rising edge of a clock signal, whereas "FF_N_D1" and "FF_N_D2" may be negative edge triggered flip-flops configured to respond to a falling edge of the clock signal.

As shown in right two columns of the table 80a, an index of a track on which a data input pin D is located and an index of a track on which a data output pin Q is located may be extracted from each of cells corresponding to a flip-flop. In some embodiments, a flip-flop may include a data input pin used for a normal operation and a scan data input pin used for a scan operation, and accordingly, as shown in FIG. 8A, indices of two tracks corresponding to the two data input pins D may be extracted. In some embodiments, variant cells may be generated from primitive cells corresponding to the combinational circuit CC50 of FIG. 5 based on the table 80a of FIG. 8A indicating locations of input pins and output pins of flip-flops.

Referring to FIG. 8B, a cell group including a plurality of cells corresponding to a hold circuit may be selected from the input cell library, and locations of input pins and locations of output pins may be extracted from the selected cell group. As shown in FIG. 8B, the input cell library may define a plurality of cells corresponding to a hold circuit, which have different functions and/or driving strengths. For example, "DLY4_D1" as a delay cell may provide a longer delay than "DLY2_D1", and "DLY4_D2" as a delay cell may provide a longer delay than "DLY2_D2". In addition, "DLY4_D1" may provide a lower driving strength than "DLY4_D2", and "DLY2_D1" may provide a lower driving strength than "DLY2_D2". "BUF_D1" as a buffer cell may provide a lower driving strength than "BUF_D2" and "BUF_D4".

As shown in right two columns of the table 80b, an index of a track on which an input pin A is located and an index of a track on which an output pin Y is located may be extracted from each of cells corresponding to a hold circuit. In some embodiments, variant cells may be generated from primitive cells corresponding to the first to sixth buffers BUF61 to BUF66 and the first and second delay circuits DLY61 and DLY62 of FIGS. 6A and 6B based on the table 80b of FIG. 8B indicating locations of input pins and output pins of hold circuits.

Figure 9:
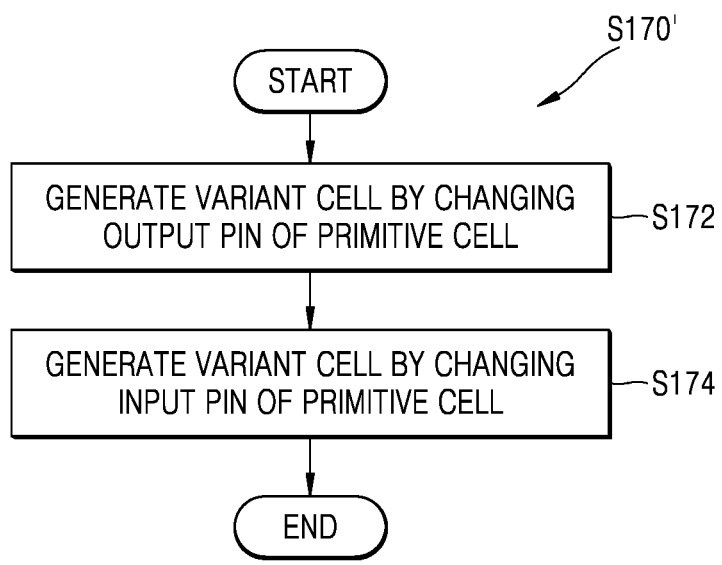
FIG. 9 is a flowchart of a method of designing an IC, according to an embodiment.

FIG. 9 is a flowchart of a method of designing an IC, according to an embodiment. Particularly, the flowchart of FIG. 9 is an example of operation S170 of FIG. 7. As described above with reference to FIG. 7, in operation S170' of FIG. 9, at least one variant cell is generated from a primitive cell. As shown in FIG. 9, operation S170' may include operations S172 and S174, and hereinafter, FIG. 9 will be described with reference to FIGS. 7, 8A, and 8B.

In operation S172, an operation of generating a variant cell by changing an output pin of a primitive cell may be performed. For example, a variant cell may be generated by changing a location of an output pin of a primitive cell, e.g., a cell corresponding to a combinational circuit, so as to correspond to a location of the data input pin D of the table 80a of FIG. 8A. In addition, a variant cell may be generated by changing a location of an output pin of a primitive cell, e.g., a cell corresponding to a hold circuit, so as to correspond to a location of the output pin Y of the table 80b of FIG. 8B.

In operation S174, an operation of generating a variant cell by changing an input pin of the primitive cell may be performed. For example, a variant cell may be generated by changing a location of an input pin of a primitive cell, e.g., a cell corresponding to a combinational circuit, so as to correspond to a location of the data output pin Q of the table 80a of FIG. 8A. In addition, a variant cell may be generated by changing a location of an input pin of a primitive cell, e.g., a cell corresponding to a hold circuit, so as to correspond to a location of the input pin A of the table 80b of FIG. 8B. In some embodiments, operations S172 and S174 may be combined, and accordingly, a variant cell may be generated by changing both an input pin and an output pin of a primitive cell.

Figure 10:
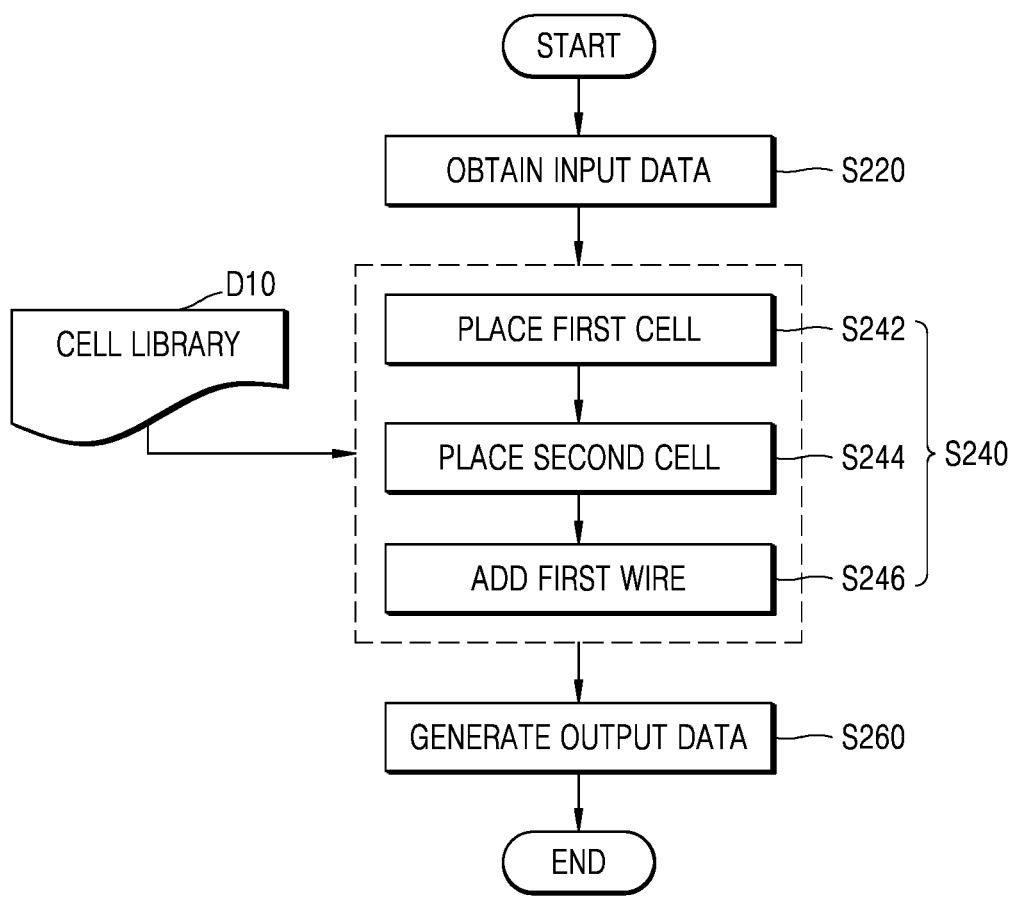
FIG. 10 is a flowchart of a method of designing an IC, according to an embodiment.

FIG. 10 is a flowchart of a method of designing an IC, according to an embodiment. Particularly, the flowchart of FIG. 10 indicates a method of designing a layout of an IC by using a cell library D10 generated by the method of FIG. 7. In some embodiments, the method of FIG. 10 may be performed by a computing system (e.g., 140 of FIG. 14) including at least one processor configured to execute a series of computer instructions. As shown in FIG. 10, the method of designing an IC may include operations S220, S240, and S260.

In operation S220, an operation of obtaining input data may be performed. The input data may indicate data defining an IC, and for example, the input data may include a netlist to be described below with reference to FIG. 12. The netlist may include information about cells and connections included in an IC.

In operation S240, place and routing (P&R) may be performed based on the cell library D10. As shown in FIG. 10, operation S240 may include a plurality of operations S242, S244, and S246, and the plurality of operations S242, S244, and S246 may be iteratively performed. First, in operation S242, an operation of placing a first cell may be performed. In some embodiments, the first cell may be one of the plurality of cells selected in operation S130 of FIG. 7, and for example, the first cell may be a cell corresponding to a flip-flop.

In operation S244, an operation of placing a second cell may be performed. The second cell may correspond to a second circuit configured to receive a signal output from a first circuit corresponding to the first cell of operation S242. The second cell may be adjacent to the first cell in the X-axis direction, i.e. a direction parallel to rows in which cells are placed, or a cell length direction. The cell library D10 may define a plurality of cells, i.e., a primitive cell and variant cells of the primitive cell, each having the same specification but including an input pin and/or an output pin located at different locations. A cell including an input pin aligned with an output pin of the first cell in the X-axis direction when placed to be adjacent or next to the first cell in the X-axis direction among the plurality of cells defined by the cell library D10 may be selected as the second cell. An example of operation S244 will be described below with reference to FIG. 11.

In operation S246, an operation of adding a first wire may be performed. The first wire may connect the output pin of the first cell to the input pin of the second cell in the same wiring layer, e.g., the first wiring layer M1. The output pin of the first cell, the first wire, and the input pin of the second cell may be formed as a single pattern extending in the X-axis direction in the first wiring layer M1, by the output pin of the first cell and the input pin of the second cell aligned in the X-axis direction, i.e., formed on the same track. In some embodiments, operation S246 may be performed after placing a plurality of cells by iteratively performing operations S242 and S244.

In some embodiments, unlike as described above, the first circuit corresponding to the first cell of operation S242 may receive a signal from the second circuit corresponding to the second cell. In this case, the second cell may include an output pin formed on the same track as that on which an input pin of the first cell, and the first wire may connect the output pin of the second cell to the input pin of the first cell in the same wiring layer, e.g., the first wiring layer M1. The output pin of the second cell, the first wire, and the input pin of the first cell may be formed as a single pattern extending in the X-axis direction in the first wiring layer M1, by the output pin of the second cell and the input pin of the first cell aligned in the X-axis direction, i.e., formed on the same track.

In operation S260, an operation of generating output data may be performed. The output data may indicate data defining a layout of an IC, for example, the output data may include layout data D14 as described below with reference to FIG. 12. The output data may define a layout of an IC including a simple cell interconnection added in operation S240.

Figure 11:
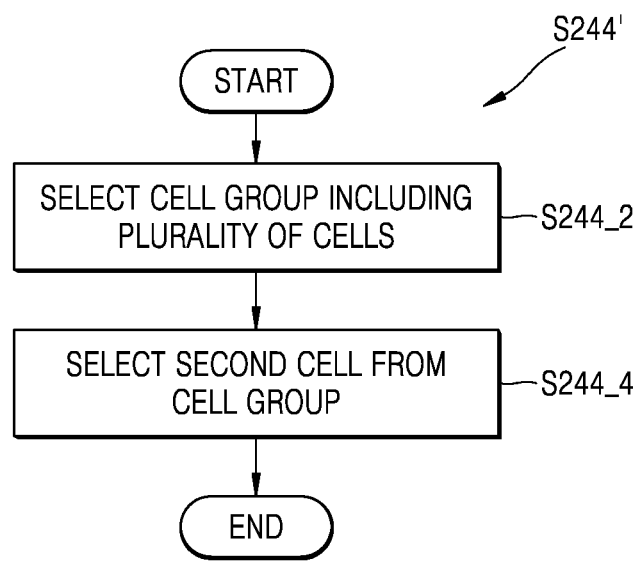
FIG. 11 is a flowchart of a method of designing an IC, according to an embodiment.

FIG. 11 is a flowchart of a method of designing an IC, according to an embodiment. Particularly, the flowchart of FIG. 11 is an example of operation S244 of FIG. 10. As described above with reference to FIG. 10, in operation S244' of FIG. 11, an operation of placing the second cell to be adjacent or next to the first cell in the X-axis direction may be performed. As shown in FIG. 11, operation S244' may include operations S244_2 and S244_4. Hereinafter, FIG. 11 will be described with reference to FIG. 10.

In operation S244_2, an operation of selecting a cell group including a plurality of cells may be performed. For example, a cell group corresponding to a second circuit configured to receive a signal from a first circuit corresponding to the first cell may be selected. The plurality of cells included in the cell group may commonly have a feature of the second circuit but include input pins and/or output pins located at different locations, respectively.

In operation S244_4, an operation of selecting the second cell from the cell group may be performed. For example, the second cell having an input pin formed on the same track as that on which an output pin of the first cell is formed among the plurality of cells included in the cell group of operation S244_2 may be selected.

Figure 12:
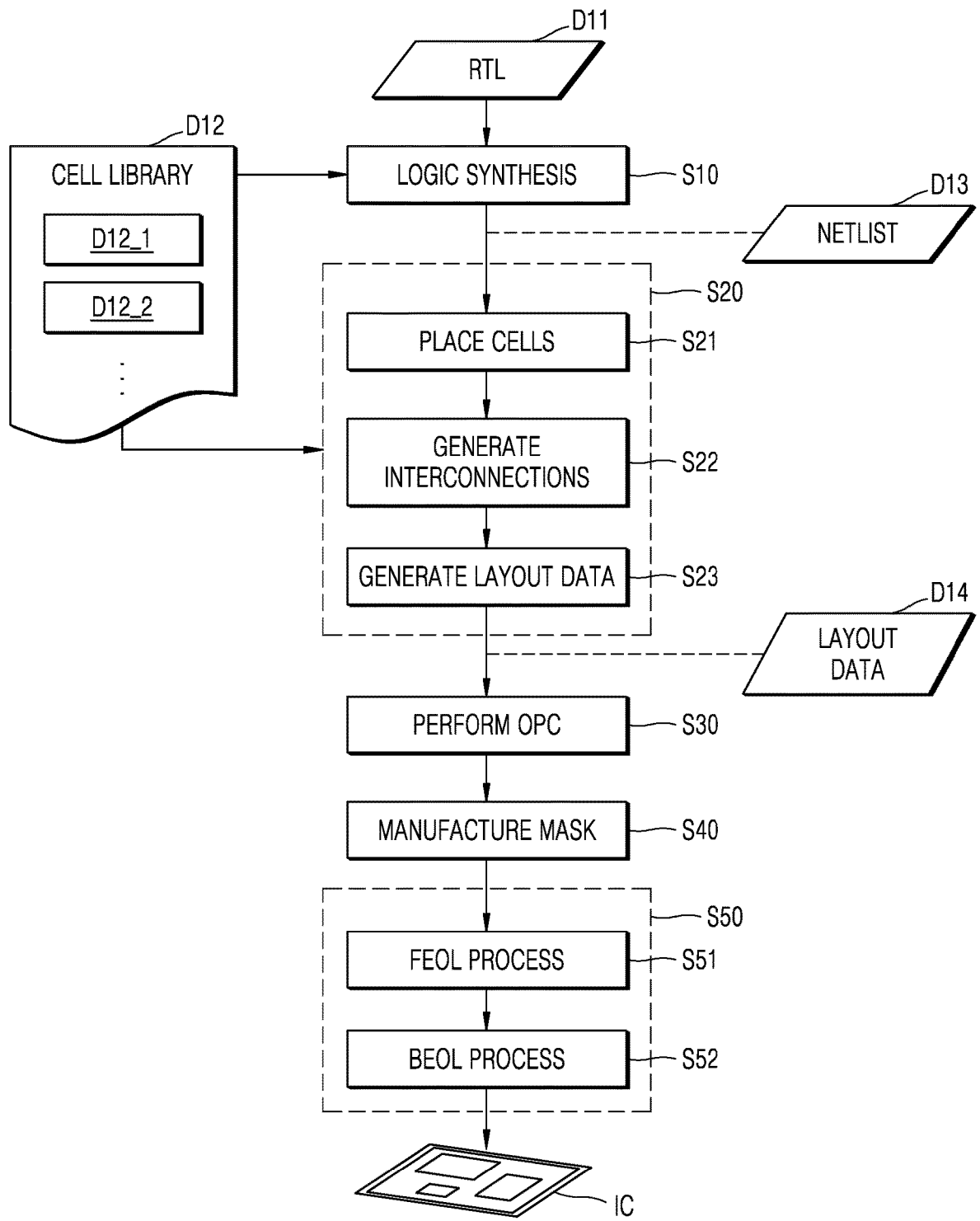
FIG. 12 is a flowchart of a method of fabricating an IC, according to an embodiment.

FIG. 12 is a flowchart of a method of fabricating an IC, according to an embodiment. The method, of FIG. 12, of fabricating an IC may include a method of designing an IC, according to an embodiment.

A cell library (or standard cell library) D12 may include information about cells, e.g., function information, characteristic information, and layout information. As shown in FIG. 12, the cell library D12 may include first data D12_1, second data D12_2, and the like respectively defining a plurality of cell groups. For example, the first data D12_1 may define a cell group including the plurality of cells of which the locations of the input pins and the locations of the output pins are extracted in operation S130 of FIG. 7, and the second data D12_2 may define a cell group including the primitive cell extracted in operation S150 of FIG. 7 and the at least one variant cell generated in operation S170 of FIG. 7.

In operation S10, a logic synthesis operation of generating netlist data D13 from register transfer level (RTL) data D11 may be performed. For example, a semiconductor design tool (e.g., a logic synthesis tool) may generate the netlist data D13 including a bitstream or a netlist by performing logic synthesis on the RTL data D11 with reference to the cell library D12. The RTL data D11 may be created by a hardware description language (HDL) such as a very high-speed integrated circuit (VHSIC) hardware description language (VHDL) or Verilog In operation S20, a P&R operation of generating layout data D14 from the netlist data D13 may be performed. As shown in FIG. 12, the P&R operation S20 may include a plurality of operations S21, S22, and S23.

In operation S21, an operation of placing cells may be performed. For example, a semiconductor design tool (e.g., a P&R tool) may place a plurality of cells from the netlist data D13 with reference to the cell library D12. As described above, the cell library D12 may include information about a primitive cell and variant cells of the primitive cell, which have the same specification, and accordingly, a cell having an output pin and/or an input pin aligned with an input pin and/or an output pin of an adjacent cell may be placed.

In operation S22, an operation of generating interconnections may be performed. An interconnection may electrically connect an output pin of a cell to an input pin of another cell, and for example, the interconnection may include a conductive pattern. As described above with reference to the drawings, a simple interconnection may be possible due to an aligned input pin and output pin of adjacent cells, and accordingly, routing may be easily performed, and routing congestion may be resolved. In addition, a structure of interconnections may be simplified, and a signal delay caused by the interconnections may be reduced.

In operation S23, an operation of generating the layout data D14 may be performed. The layout data D14 may have a format, for example, GDSII, and include geometric information about cells and interconnections.

In operation S30, optical proximity correction (OPC) may be performed. OPC may indicate a work for forming a pattern of a desired shape by correcting a distortion phenomenon such as refraction caused by characteristics of light in photolithography included in a semiconductor process for fabricating an IC, and a pattern on a mask may be determined by applying OPC to the layout data D14. In some embodiments, a layout of an IC may be restrictively modified in operation S30, and the restrictively modifying of the IC in operation S30 is post-processing for optimizing a structure of the IC and may be referred to as design polishing.

In operation S40, an operation of manufacturing a mask may be performed. For example, patterns on a mask may be defined to form patterns in a plurality of layers by applying OPC to the layout data D14, and at least one mask (or photomask) for forming the respective patterns of the plurality of layers may be manufactured.

In operation S50, an operation of fabricating an IC may be performed. For example, the IC may be fabricated by using the at least one mask, manufactured in operation S40, to pattern a plurality of layers. As shown in FIG. 12, operation S50 may include operations S51 and S52.

In operation S51, a front-end-of-line (FEOL) process may be performed. The FEOL process may indicate a process of forming individual devices, e.g., transistors, capacitors, and resistors on a substrate in a process of fabricating an IC. For example, the FEOL process may include planarizing and cleaning a wafer, forming a trench, forming a well, forming a gate electrode, forming a source and a drain, and the like.

In operation S52, a BEOL process may be performed. The BEOL process may indicate a process of interconnecting individual devices, e.g., transistors, capacitors, and resistors on a substrate in a process of fabricating an IC. For example, the BEOL process may include siliciding gate, source and drain regions, adding a dielectric, performing planarization, forming a hole, adding a metal layer, forming a via, forming a passivation layer, and the like. Thereafter, the IC may be packaged in a semiconductor package and used as a component of various applications. In some embodiments, a middle-of line (MOL) process may be performed between operations S51 and S52. The MOL process may include forming contacts, such as a source/drain contact, a gate contact, etc., in individual devices.

Figure 13:
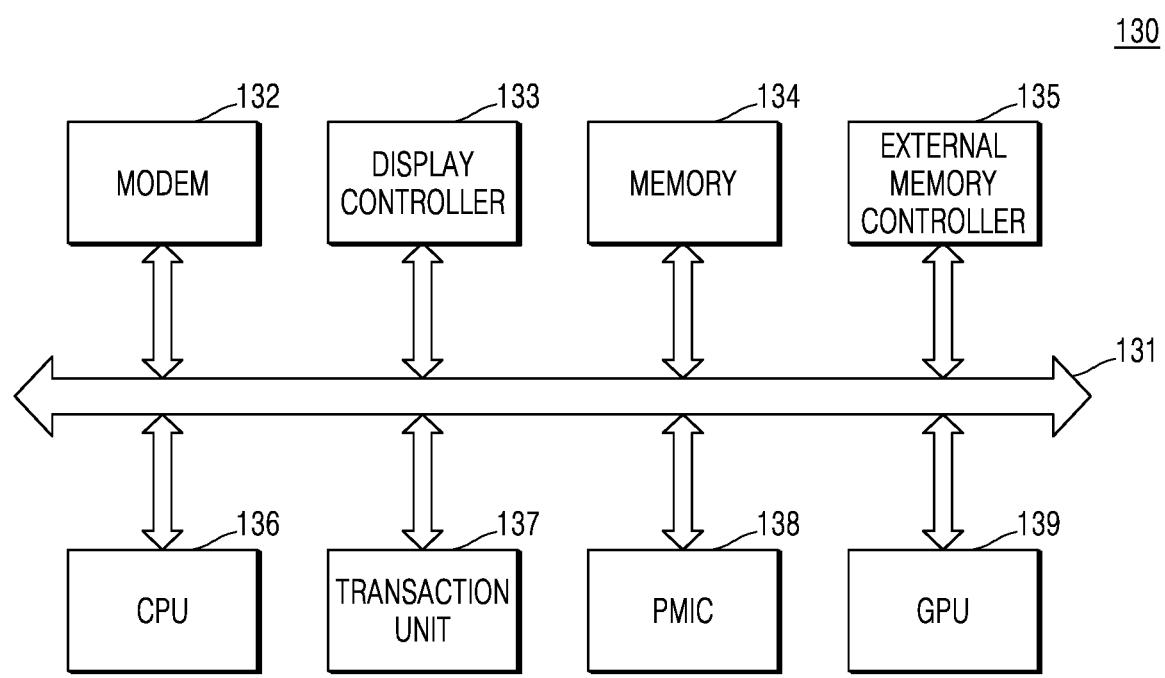
FIG. 13 is a block diagram of a system on chip (SoC) according to an embodiment.

FIG. 13 is a block diagram of a system on chip (SoC) 130 according to an embodiment. The SoC 130 is a semiconductor device and may include an IC according to an embodiment. The SoC 130 is obtained by implementing, in a single chip, complicated function blocks, such as an intellectual property (IP) block, for performing various functions, and the SoC 130 may be designed by the method of designing an IC, according to embodiments, and accordingly, the SoC 130 for providing an improved level of integration, performance, and reliability may be achieved. Referring to FIG. 13, the SoC 130 may include a modem 132, a display controller 133, a memory 134, an external memory controller 135, a central processing unit (CPU) 136, a transaction unit 137, a power management integrated circuit (PMIC) 138, and a graphics processing unit (GPU) 139, and the function blocks of the SoC 130 may communicate with each other via a system bus 131.

The CPU 136 capable of generally controlling an operation of the SoC 130 may control operations of the other function blocks 132 to 139. The modem 132 may demodulate a signal received from the outside of the SoC 130, or modulate a signal generated inside the SoC 130 and transmit the modulated signal to the outside. The external memory controller 135 may control an operation of transmitting and receiving data to and from an external memory device connected to the SoC 130. For example, a program and/or data stored in the external memory device may be provided to the CPU 136 or the GPU 139 under control of the external memory controller 135. The GPU 139 may execute program instructions associated with graphics processing. The GPU 139 may receive graphic data through the external memory controller 135 and transmit graphic data processed by the GPU 139 to the outside of the SoC 130 through the external memory controller 135. The transaction unit 137 may monitor a data transaction of each function block, and the PMIC 138 may control power to be provided to each function block under control of the transaction unit 137. The display controller 133 may transmit data generated inside the SoC 130 to a display (or a display device) outside the SoC 130 by controlling the display. The memory 134 may include a nonvolatile memory such as electrically erasable programmable read-only memory (EEPROM) or flash memory or a volatile memory such as dynamic random access memory (DRAM) or static random access memory (SRAM).

Figure 14:
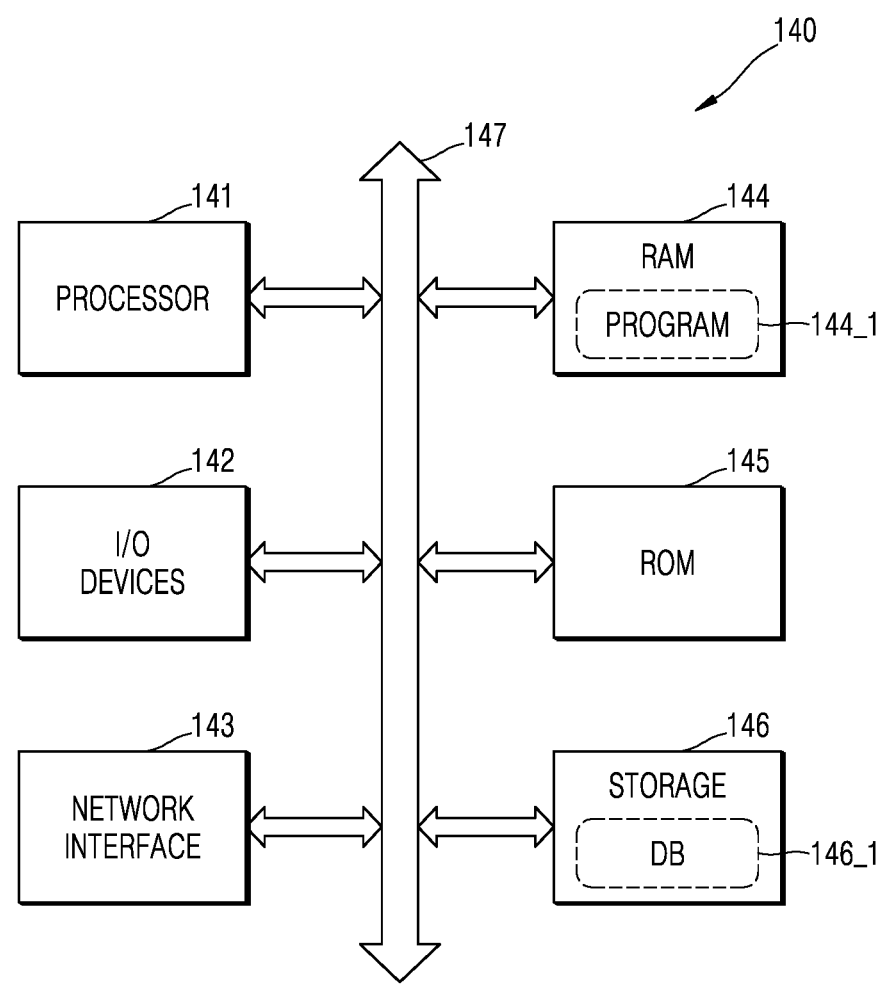
FIG. 14 is a block diagram of a computing system including a memory storing a program, according to an embodiment.

FIG. 14 is a block diagram of a computing system 140 including a memory storing a program, according to an embodiment. At least some of operations of a method of designing an IC, in some embodiments, e.g., the method of FIG. 7 and/or the method of FIG. 10, may be performed by the computing system (or computer) 140.

The computing system 140 may be a stationary computing system such as a desktop computer, a workstation, or a server or a portable computing system such as a laptop computer. As shown in FIG. 14, the computing system 140 may include a processor 141, input/output (I/O) devices 142, a network interface 143, random access memory (RAM) 144, read only memory (ROM) 145, and a storage 146. The processor 141, the input/output devices 142, the network interface 143, the RAM 144, the ROM 145, and the storage 146 may be connected to a bus 147 and communicate with each other via the bus 147.

The processor 141 may be referred to as a processing unit and include at least one core, e.g., a micro-processor, an application processor (AP), a digital signal processor (DSP), and a GPU, capable of executing an arbitrary instruction set (e.g., Intel Architecture-32 (IA-32), 64-bit extended IA-32, x86-64, PowerPC, Sparc, million instructions per second (MIPS), advanced RISC (reduced instruction set computer) machine (ARM), or IA-64) For example, the processor 141 may access a memory, i.e., the RAM 144 or the ROM 145, via the bus 147 and execute instructions stored in the RAM 144 or the ROM 145.

The RAM 144 may store a program 144_1 for a method of designing an IC, according to an embodiment, or at least a portion of the program 144_1, and the program 144_1 may allow the processor 141 to perform at least some of operations included in the method of designing an IC, e.g., the method of FIG. 7 and/or the method of FIG. 10. That is, the program 144_1 may include a plurality of instructions executable by the processor 141, and the plurality of instructions included in the program 144_1 may allow the processor 141 to perform at least some of operations included in, for example, the flowchart described above with reference to FIG. 10.

The storage 146 may not lose stored data even when power supplied to the computing system 140 is cut off. For example, the storage 146 may include a nonvolatile memory device or a storage medium such as a magnetic tape, an optical disc, or a magnetic disc. In addition, the storage 146 may be detachable from the computing system 140. The storage 146 may store the program 144_1 according to an embodiment, and before the program 144_1 is executed by the processor 141, the program 144_1 or at least a portion of the program 144_1 may be loaded from the storage 146 to the RAM 144. Alternatively, the storage 146 may store a file created by a program language, and the program 144_1 generated from the file by a compiler or the like or at least a portion of the program 144_1 may be loaded to the RAM 144. In addition, as shown in FIG. 14, the storage 146 may include a database (DB) 146_1, and the database 146_1 may contain information required to design an IC, e.g., the cell library D10 of FIG. 10.

The storage 146 may store data to be processed by the processor 141 or data processed by the processor 141. That is, the processor 141 may generate data by processing data stored in the storage 146 and store the generated data in the storage 146, according to the program 144_1. For example, the storage 146 may store the RTL data D12, the netlist data D13, and the layout data D14 of FIG. 12.

The input/output devices 142 may include input devices such as a keyboard and a pointing device and output devices such as a display device and a printer. For example, through the input/output devices 142, a user may trigger execution of the program 144_1 by the processor 141, input the RTL data D12 and/or the netlist data D13 of FIG. 12, and check the layout data D14 of FIG. 12.

The network interface 143 may provide an access to a network outside the computing system 140. For example, the network may include a plurality of computing systems and communication links, and the communication links may include wired links, optical links, radio links, or other arbitrary-types of links.

While the inventive concept has been particularly shown and described with reference to embodiments thereof, it will be understood that various changes in form and details may be made therein without departing from the spirit and scope of the following claims.

What is claimed is:

1. An integrated circuit (IC) comprising:
a first cell comprising an input pin and an output pin extending in a first direction;
a second cell adjacent to the first cell in the first direction and comprising an input pin and an output pin extending in the first direction;
a first cell isolation layer extending between the first cell and the second cell in a second direction crossing the first direction; and
a first wire extending in the first direction, overlapping the first cell isolation layer, and connected to the output pin of the first cell and the input pin of the second cell,
wherein the output pin of the first cell, the input pin of the second cell, and the first wire are formed in a first conductive layer as a first pattern extending in the first direction.

2. The IC of claim 1, further comprising:
a third cell adjacent to the second cell in the first direction and comprising an input pin and an output pin extending in the first direction;
a second cell isolation layer extending between the second cell and the third cell in the second direction; and
a second wire extending in the first direction, overlapping the second cell isolation layer, and connected to the output pin of the second cell and the input pin of the third cell,
wherein the output pin of the second cell, the input pin of the third cell, and the second wire are formed in the first conductive layer as a second pattern extending in the first direction.

3. The IC of claim 2, wherein the second cell is a flip-flop, wherein the input pin of the second cell is a data input pin of the flip-flop, and
wherein the output pin of the second cell is a data output pin of the flip-flop.

4. The IC of claim 2, wherein the first cell isolation layer and the second cell isolation layer are aligned in the second direction, and
wherein the first cell and the second cell are adjacent to each other in the second direction.

5. The IC of claim 2, wherein the first cell is a flip-flop, wherein the output pin of the first cell is a data output pin of the flip-flop, and
wherein the second cell is a buffer or a delay cell.

6. The IC of claim 2, further comprising:
a fourth cell adjacent to the third cell in the first direction and comprising an input pin and an output pin extending in the first direction;
a third cell isolation layer extending in the second direction between the third cell and the fourth cell; and
a third wire extending in the first direction, overlapping the third cell isolation layer, and connected to the output pin of the third cell and the input pin of the fourth cell,
wherein the output pin of the third cell, the input pin of the fourth cell, and the third wire are formed in the first conductive layer as a third pattern extending in the first direction.

7. The IC of claim 6, wherein the input pin of the first cell, the output pin of the second cell, the input pin of the third cell, and the output pin of the fourth cell are aligned in the first direction, and
wherein the output pin of the first cell, the input pin of the second cell, the output pin of the third cell, and the input pin of the fourth cell are aligned in the first direction.

8. The IC of claim 7, wherein the first cell, the second cell, the third cell, and the fourth cell have the same specification.

9. The IC of claim 1, wherein the first cell comprises:
at least one active pattern extending in the first direction;
at least one gate electrode extending in the second direction and intersecting with the at least one active pattern;
a source/drain region on one side of the at least one gate electrode; and
a source/drain contact and/or a source/drain via between the source/drain region and the first pattern.

10. The IC of claim 1, wherein the second cell comprises:
at least one active pattern extending in the first direction;
at least one gate electrode extending in the second direction and intersecting with the at least one active pattern; and
a gate via between the at least one gate electrode and the first pattern.

11. The IC of claim 1, wherein the first conductive layer comprises:
at least one pattern connected to a gate via and electrically connected to a gate electrode through the gate via;
at least one pattern connected to a source/drain via and electrically connected to a source/drain region through a source/drain contact and the source/drain via; and
at least one pattern connected to a pattern of a second conductive layer through a via of a first via layer.

12. An integrated circuit (IC) comprising:
a first cell and a second cell, each comprising an input pin and an output pin in a back-end-of-line (BEOL) and having the same specification as each other;
a third cell adjacent to the first cell in a first direction; and
a fourth cell adjacent to the second cell in the first direction,
wherein the output pin of the first cell and an input pin of the third cell, or the input pin of the first cell and an output pin of the third cell are formed in a first conductive layer as a first pattern extending in the first direction,
wherein the output pin of the second cell and an input pin of the fourth cell, or the input pin of the second cell and an output pin of the fourth cell are formed in the first conductive layer as a second pattern extending in the first direction, and
wherein the BEOL of the first cell structurally differs from the BEOL of the second cell.

13. The IC of claim 12, further comprising:
a fifth cell comprising an input pin and an output pin in the BEOL; and
a sixth cell adjacent to the fifth cell in the first direction,
wherein the input pin of the fifth cell and an output pin of the sixth cell, or the output pin of the fifth cell and an input pin of the sixth cell are formed in the first conductive layer as a third pattern extending in the first direction,
wherein the fifth cell has the same specification as the first cell, and
wherein the BEOL of the fifth cell structurally differs from the BEOL of the first cell and the BEOL of the second cell.

14. The IC of claim 12, wherein each of the third cell and the fourth cell is a flip-flop,
wherein the input pin and the output pin of the third cell are a data input pin and a data output pin of the flip-flop, respectively, and
wherein the input pin and the output pin of the fourth cell are a data input pin and a data output pin of the flip-flop, respectively.

15. The IC of claim 14, wherein the first cell is a buffer or a delay cell.

16. The IC of claim 12, wherein each of the first cell, the second cell, the third cell, and the fourth cell comprises power lines extending in parallel to each other in the first direction in the first conductive layer,
- wherein the first pattern is on a first track among a plurality of tracks extending in parallel to each other between the power lines in the first direction, and
- wherein the second pattern is on a second track among the plurality of tracks.

17. A method of designing an integrated circuit (IC), the method comprising:
- placing a first cell from a cell library based on input data defining the IC;
- placing a second cell from the cell library to be adjacent to the first cell in a first direction, based on the input data;
- adding a first wire connecting an output pin of the first cell to an input pin of the second cell, based on the input data; and
- generating output data defining a layout of the IC,
- wherein the output data defines a first pattern extending in the first direction in a first conductive layer and forming the output pin of the first cell, the input pin of the second cell, and the first wire.

18. The method of claim 17, wherein the placing the second cell comprises:
- selecting a cell group including a plurality of cells having the same specification from the cell library, based on the input data; and
- selecting the second cell from among the plurality of cells, based on a location of the output pin of the first cell and locations of input pins of the plurality of cells.

19. The method of claim 18, wherein the output pin of the first cell and the input pin of the second cell are aligned in the first direction.

20. The method of claim 17, further comprising:
- placing a third cell from the cell library to be adjacent to the first cell in the first direction, based on the input data; and
- adding a second wire connecting an input pin of the first cell to an output pin of the third cell, based on the input data,
- wherein the output data defines a second pattern extending in the first direction in the first conductive layer and forming the input pin of the first cell, the output pin of the third cell, and the second wire.

* * * * *